United States Patent
Tamaki et al.

(10) Patent No.: US 9,899,589 B2
(45) Date of Patent: Feb. 20, 2018

(54) THERMAL POWER GENERATION UNIT AND THERMOELECTRIC POWER GENERATION SYSTEM

(71) Applicant: Panasonic Corporation, Osaka (JP)

(72) Inventors: Hiromasa Tamaki, Osaka (JP); Tsutomu Kanno, Kyoto (JP); Akihiro Sakai, Nara (JP); Kohei Takahashi, Osaka (JP); Hideo Kusada, Osaka (JP); Yuka Yamada, Nara (JP)

(73) Assignee: PANASONIC CORPORATION, Osaka (JP)

( * ) Notice: Subject to any disclaimer, the term of this patent is extended or adjusted under 35 U.S.C. 154(b) by 291 days.

(21) Appl. No.: 14/574,044

(22) Filed: Dec. 17, 2014

(65) Prior Publication Data
US 2015/0221849 A1      Aug. 6, 2015

(30) Foreign Application Priority Data

Feb. 5, 2014  (JP) ................. 2014-020403

(51) Int. Cl.
*H01L 35/28* (2006.01)
*H01L 35/32* (2006.01)
*H01L 35/30* (2006.01)

(52) U.S. Cl.
CPC .............. *H01L 35/32* (2013.01); *H01L 35/30* (2013.01)

(58) Field of Classification Search
CPC ..................... H01L 35/00; H01L 35/02–35/34
USPC ................................................ 136/200–242
See application file for complete search history.

(56) References Cited

U.S. PATENT DOCUMENTS

| | | | | |
|---|---|---|---|---|
| 6,166,317 A | * | 12/2000 | Volk, Jr. | ........ B60L 11/18 136/201 |
| 2008/0173343 A1 | | 7/2008 | Kanno et al. | |
| 2009/0301541 A1 | * | 12/2009 | Watts | ........ F24J 2/42 136/205 |
| 2013/0068273 A1 | | 3/2013 | Kanno et al. | |

(Continued)

FOREIGN PATENT DOCUMENTS

| | | |
|---|---|---|
| JP | 2011-165976 | 8/2011 |
| JP | 2013-016685 | 1/2013 |

(Continued)

OTHER PUBLICATIONS

Kanno et al., "Tubular power generator via off-diagonal thermo-electric effect" Proceedings of the 72nd JSAP Autumn Meeting, 30a- F -14 (2011).

(Continued)

*Primary Examiner* — Niki Bakhtiari
(74) *Attorney, Agent, or Firm* — McDermott Will & Emery LLP

(57) ABSTRACT

A thermoelectric power generation system of the present disclosure includes first and second thermoelectric power generation units. Each of the thermoelectric power generation units includes a plurality of tubular thermoelectric generators. The first and second thermoelectric power generation units are electrically connected to each other such that a first impedance caused by the tubular thermoelectric generator included in the first thermoelectric power generation unit is matched with a second impedance caused by the tubular thermoelectric generator included in the second thermoelectric power generation unit.

1 Claim, 27 Drawing Sheets

(56) References Cited

U.S. PATENT DOCUMENTS

2013/0146117 A1* 6/2013 Brady ................... H01L 35/02
136/201
2014/0102499 A1 4/2014 Takahashi et al.

FOREIGN PATENT DOCUMENTS

| JP | 2013-099201 | 5/2013 |
|----|-------------|--------|
| WO | 2008/056466 | 5/2008 |
| WO | 2012/014366 | 2/2012 |
| WO | 2013/161174 | 10/2013 |

OTHER PUBLICATIONS

Sakai et al., "Enhancement in performance of the tubular thermoelectric generator (TTEG)" International conference on thermoelectrics 2012, p. 328.

* cited by examiner

THERMAL POWER GENERATION UNIT AND THERMOELECTRIC POWER GENERATION SYSTEM

BACKGROUND

1. Field of the Invention

The present disclosure relates to a thermoelectric power generation unit provided with a thermoelectric conversion element converting heat into power. The present disclosure also relates to a thermoelectric power generation system provided with a plurality of thermoelectric power generation units.

2. Description of the Related Art

The thermoelectric conversion element can convert the heat into the power or convert the power into the heat. The thermoelectric conversion element made of a thermoelectric material exerting a Seebeck effect can acquire thermal energy from a heat source having relatively low temperature (for example, 200° C. or less) to convert the heat into the power. The thermal energy that is conventionally abandoned into a surrounding environment in a state of vapor, hot water, or emission gas can be recovered and effectively used in a thermoelectric power generation technology in which the thermoelectric conversion element is used.

Hereinafter, the thermoelectric conversion element made of the thermoelectric material is referred to as a "thermoelectric generator". A general thermoelectric generator has what is called a "t-type structure" in which a p-type semiconductor and an n-type semiconductor, in which electric poralities of carriers are different from each other, are combined (for example, see Unexamined Japanese Patent Publication No. 2013-016685). In the thermoelectric generator having the "π-type structure", the p-type semiconductor and the n-type semiconductor are electrically connected in series, and thermally connected in parallel. In the "π-type structure", a thermal flow direction and a current flow direction are parallel or anti-parallel to each other. For this reason, it is necessary to provide an output terminal in an electrode on a high-temperature heat source side or a low-temperature heat source side. Accordingly, a wiring structure becomes complicated in order to electrically connect a plurality of thermoelectric generators having the "π-type structure" in series.

International Patent Publication No. 2008/056466 discloses a thermoelectric generator including a stacked body in which bismuth layers and metallic layers made of metal except bismuth are alternately stacked between a first electrode and a second electrode. The first electrode and the second electrode are opposed to each other. In the thermoelectric generator disclosed in International Patent Publication No. 2008/056466, a stacking plane is tilted with respect to a direction of a straight line connecting the first electrode and the second electrode. Tube-type thermoelectric generators are disclosed in International Patent Publication No. 2012/014366, Kanno et al., Proceedings of the 72nd JSAP Autumn Meeting, 30a-A-14 "Tubular power generator via off-diagonal thermoelectric effect" (2011), and A. Sakai et al., International conference on thermoelectrics 2012, 328 "Enhancement in performance of the tubular thermoelectric generator (TTEG)" (2012).

SUMMARY

There is a demand for practical thermoelectric power generation unit and system in which the thermoelectric power generation technology is used.

A thermoelectric power generation system of the present disclosure includes first and second thermoelectric power generation units. At this point, each of the first and second thermoelectric power generation units includes a plurality of tubular thermoelectric generators, each of the plurality of tubular thermoelectric generators includes: an outer circumferential surface; an inner circumferential surface; and a flow passage that is partitioned by the inner circumferential surface, an electromotive force is generated in an axial direction of each of the tubular thermoelectric generators by a temperature difference between the inner circumferential surface and the outer circumferential surface, each of the first and second thermoelectric power generation units further includes: a vessel in which the plurality of tubular thermoelectric generators are accommodated, the vessel including a fluid inlet, a fluid outlet, and a plurality of openings, the fluid inlet and the fluid outlet being used to cause a fluid to flow in the vessel, each of the tubular thermoelectric generators being inserted in the plurality of openings; and a plurality of conductive members that electrically connect the plurality of tubular thermoelectric generators, and the first and second thermoelectric power generation units are electrically connected such that a first impedance matching condition caused by the plurality of tubular thermoelectric generators included in the first thermoelectric power generation unit is matched with a second impedance matching condition caused by the plurality of tubular thermoelectric generators included in the second thermoelectric power generation unit.

A thermoelectric power generation unit of the present disclosure includes a plurality of tubular thermoelectric generators. At this point, each of the plurality of tubular thermoelectric generators includes: an outer circumferential surface; an inner circumferential surface; and a flow passage that is partitioned by the inner circumferential surface, an electromotive force is generated in an axial direction of each of the tubular thermoelectric generators by a temperature difference between the inner circumferential surface and the outer circumferential surface, the tubular thermoelectric generator is electrically connected to another tubular thermoelectric generator in series such that an impedance caused by the tubular thermoelectric generator is matched with an impedance caused by another tubular thermoelectric generator, the thermoelectric power generation unit further includes: a vessel in which the plurality of tubular thermoelectric generators are accommodated, the vessel including a fluid inlet, a fluid outlet, and a plurality of openings, the fluid inlet and the fluid outlet being used to cause a fluid to flow in the vessel, each of the tubular thermoelectric generators being inserted in the plurality of openings; and a plurality of conductive members that electrically connect the plurality of tubular thermoelectric generators.

In the thermoelectric power generation unit and system of the present disclosure, the practical use of the thermoelectric power generation is enhanced.

DETAILED DESCRIPTION OF THE EMBODIMENT

One aspect of a not limited, but exemplary thermoelectric power generation unit of the present disclosure includes a plurality of tubular thermoelectric generators, and each of the tubular thermoelectric generators includes an outer circumferential surface, an inner circumferential surface, and a flow passage partitioned by the inner circumferential surface. Each of the tubular thermoelectric generators is configured such that an electromotive force is generated in an axial direction of each of the tubular thermoelectric generators by a temperature difference between the inner circumferential surface and the outer circumferential surface.

The thermoelectric power generation unit further includes a vessel in which the plurality of tubular thermoelectric generators are accommodated and a plurality of conductive members that electrically connect the plurality of tubular thermoelectric generators. The vessel includes a fluid inlet and a fluid outlet, through which a fluid is allowed to flow in the vessel, and a plurality of openings in each of which the tubular thermoelectric generator is inserted. The thermoelectric power generation unit further includes a plurality of conductive ring-shaped members in each of which one end of the tubular thermoelectric generator is inserted such that the conductive ring-shaped member comes into contact with the outer circumferential surface of the tubular thermoelectric generator. Each of the conductive ring-shaped members electrically connects the tubular thermoelectric generator to the corresponding conductive member.

<Basic Configuration and Operating Principle of Thermoelectric Generator>

A basic configuration and a operating principle of a thermoelectric generator used in the thermoelectric power generation unit will be described in advance of the description of the thermoelectric power generation unit according to an exemplary embodiment of the present disclosure. As described later, a tubular thermoelectric generator is used in the thermoelectric power generation unit of the present disclosure. However, the operating principle of the tubular thermoelectric generator can easily be understood by the description of the thermoelectric generator having a simpler shape.

Figure 1A:
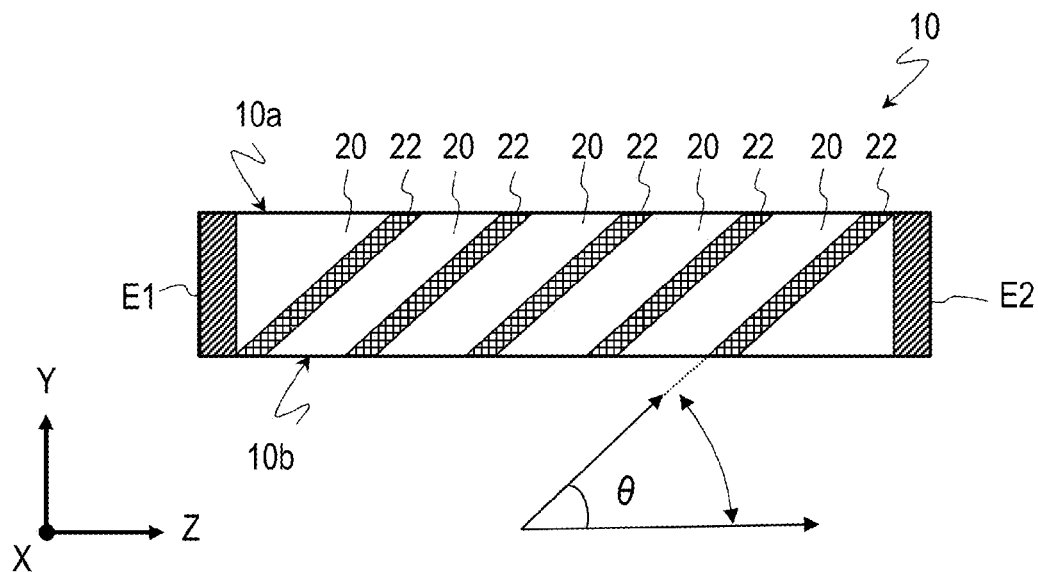
FIG. 1A is a sectional view of a thermoelectric generator.
Figure 1B:
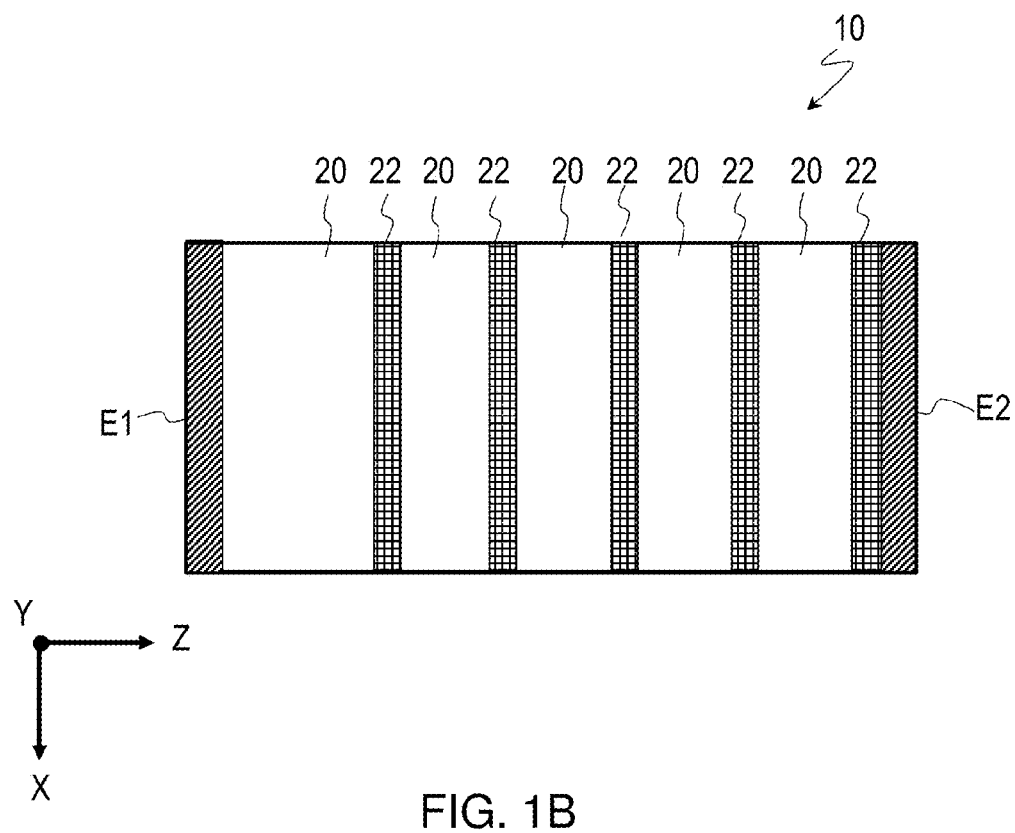
FIG. 1B is a plan view of the thermoelectric generator in FIG. 1A.

Referring to FIGS. 1A and 1B, FIG. 1A is a sectional view of thermoelectric generator 10 having a substantially rectangular parallelepiped shape, and FIG. 1B is a plan view of thermoelectric generator 10. For the sake of convenience, an orthogonal X-axis, Y-axis, and Z-axis are indicated in FIGS. 1A and 1B. Thermoelectric generator 10 in FIGS. 1A and 1B has a structure (stacked body) in which metallic layers 20 and thermoelectric material layers 22 are alternately stacked with being tilted. In FIGS. 1A and 1B, the stacked body has the rectangular parallelepiped shape. However, the same operating principle holds true for a stacked body having another shape.

In thermoelectric generator 10 of FIGS. 1A and 1B, first electrode E1 and second electrode E2 are provided such that the stacked body is horizontally sandwiched therebetween. In a section of FIG. 1A, a stacking plane is tilted by an angle θ (0<θ<π radian) with respect to a Z-axis direction.

In thermoelectric generator 10 having the above configuration, when a top temperature difference is provided between surface 10a and bottom surface 10b, a Z-axis-direction component is generated in a temperature gradient of each thermoelectric material layer 22 because heat is preferentially transferred to metallic layer 20 having thermal conductivity higher than that of thermoelectric material layer 22. An electromotive force in the Z-axis direction is generated by a Seebeck effect in each thermoelectric material layer 22, and the electromotive forces are serially overlapped with one another in the stacked body. As a result, a large potential difference is generated between first electrode E1 and second electrode E2. International Patent Publication No. 2008/056466 discloses the thermoelectric generator including the stacked body in FIGS. 1A and 1B. This application is based on U.S. Pat. No. 7,601,909, the entire content of which is hereby incorporated by reference.

Figure 2:
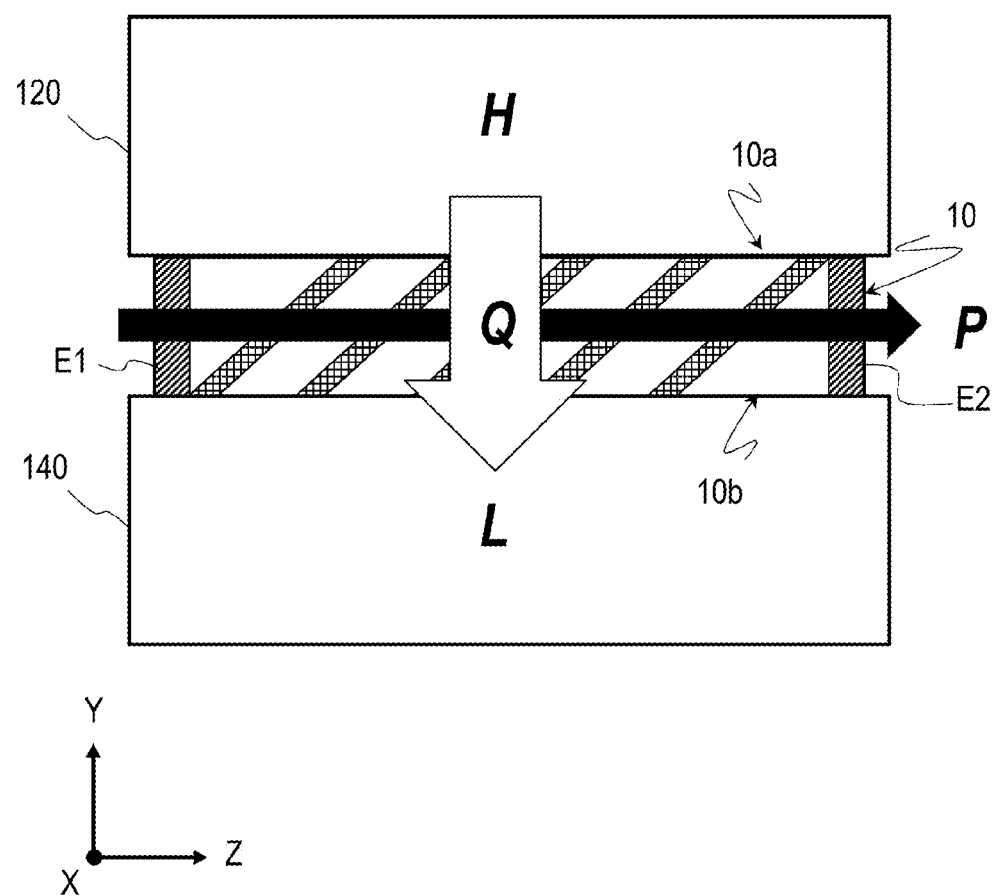
FIG. 2 is a view illustrating a state in which a high-temperature heat source is brought into contact with a top surface of the thermoelectric generator with a low-temperature heat source being brought into contact with a bottom surface.

FIG. 2 is a view illustrating a state in which high-temperature heat source 120 is brought into contact with top surface 10a of thermoelectric generator 10 with low-temperature heat source 140 being brought into contact with bottom surface 10b. In the state of FIG. 2, heat Q flows from high-temperature heat source 120 to low-temperature heat source 140 via thermoelectric generator 10, and power P can be taken out from thermoelectric generator 10 via first electrode E1 and second electrode E2. In a large sense, in thermoelectric generator 10, the direction (Y-axis direction) of the temperature gradient and the direction (Z-axis direction) of the current are orthogonal to each other, but it is not necessary to provide the temperature difference between a pair of electrodes E1 and E2. In FIG. 2, for example, power P flowing from the left side toward the right wise is schematically illustrated. However, the flow of power P is illustrated in FIG. 2 only by way of example. For example, sometimes power P flows reversely by changing a kind of a thermoelectric material used.

In the above description, for the sake of convenience, the stacked body of thermoelectric generator 10 has the rectangular parallelepiped shape. In the following exemplary embodiment, the thermoelectric generator includes the tubular stacked body. Hereinafter, the tubular thermoelectric generator is referred to as a tubular thermoelectric generator. The term "tube" is not distinguished from the term "pipe", but interpreted so as to include both the "tube" and the "pipe".

<Outline of Thermoelectric Power Generation Unit>

An outline of the thermoelectric power generation unit of the present disclosure will be described below.

Figure 3A:
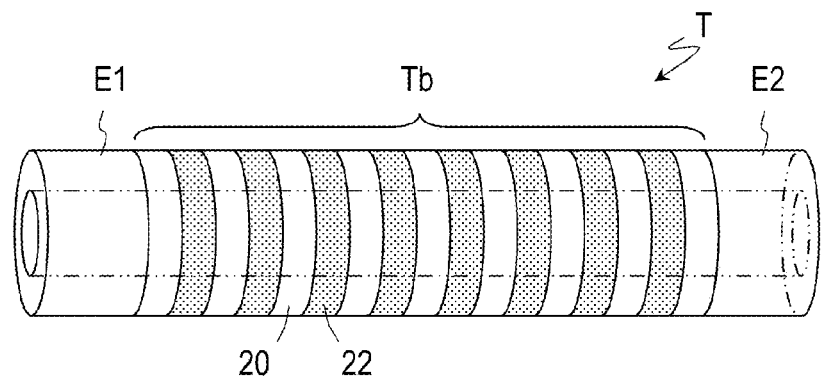
FIG. 3A is a perspective view illustrating a schematic configuration of a tubular thermoelectric generator that can be used in an exemplary thermoelectric power generation unit of the present disclosure.
Figure 3B:
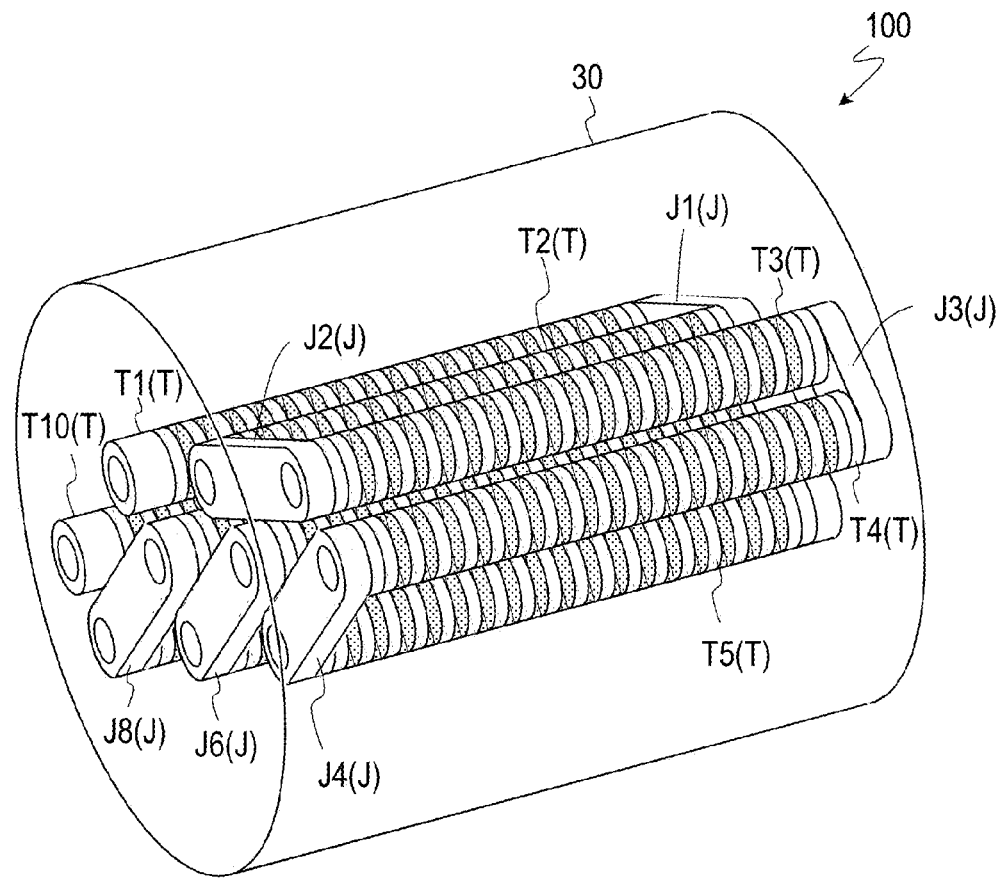
FIG. 3B is a perspective view illustrating a schematic configuration of exemplary a thermoelectric power generation unit of the present disclosure.

Referring to FIGS. 3A and 3B, FIG. 3A is a perspective view illustrating an example of tubular thermoelectric generator T. Tubular thermoelectric generator T includes tube body Tb and the pair of electrodes E1 and E2. In tube body Tb, metallic layers 20 and thermoelectric material layers 22 include through-holes in the center thereof, and are alternately stacked with being tilted. For example, International Patent Publication No. 2012/014366 discloses a method for producing tubular thermoelectric generator T. According to the method disclosed in International Patent Publication No. 2012/014366, metallic cups including holes in bottoms thereof and thermoelectric material cups including holes in bottoms thereof are alternately overlapped, and subjected to plasma sintering to be bonded to each other. This application is based on International Patent Publication No. 2012/014366, the entire content of which is hereby incorporated by reference.

In tubular thermoelectric generator T of FIG. 3A, for example, an internal flow passage (hereinafter, sometimes referred to as "internal flow passage") defined by the inner circumferential surface of tubular thermoelectric generator T is connected to piping such that a high-temperature medium flows therein. In such cases, the outer circumferential surface of tubular thermoelectric generator T is brought into contact with a low-temperature medium. Therefore, the temperature difference is provided between the inner circumferential surface and outer circumferential surface of tubular thermoelectric generator T, the potential difference is generated between the pair of electrode E1 and E2 to be able to take out the power.

As used herein, the terms "high temperature" and "low temperature" in the "high-temperature medium" or "low-temperature medium" express not a specific temperature of each medium, but a relative temperature between the high-temperature medium and the low-temperature medium. Typically, the "medium" means a fluid made of gas, liquid, or a mixture thereof. The "medium" may include solids, such as powders, which are dispersed in the fluid.

Tubular thermoelectric generator T is not limited to a cylindrical shape, but any shape may be used as long as tubular thermoelectric generator T is tubular. In other words, when tubular thermoelectric generator T is cut in a plane perpendicular to an axis of tubular thermoelectric generator T, the shapes on the cut plane of the "outer circumferential surface" and "inner circumferential surface" are not necessarily circular, but the shapes may be closed curves such as an ellipse and a polygon. Typically, the axis of the tubular thermoelectric generator T is a straight line. However, the axis of the tubular thermoelectric generator T is not limited to the straight line. These points are clear from the thermoelectric power generation principle described with reference to FIGS. 1A, 1B, and 2.

FIG. 3B is a perspective view illustrating a schematic configuration of exemplary thermoelectric power generation unit 100 of the present disclosure. Thermoelectric power generation unit 100 in FIG. 3B includes a plurality of tubular thermoelectric generators T, vessel 30 in which the plurality of tubular thermoelectric generators T are accommodated, and a plurality of conductive members J that electrically connect the plurality of tubular thermoelectric generators T. In FIG. 3B, for example, ten tubular thermoelectric generators T1 to T10 are accommodated in vessel 30. Typically, ten tubular thermoelectric generators T1 to T10 are disposed in parallel to one another. However, a disposition mode is not limited to the mode in FIG. 3B.

As described above, each of tubular thermoelectric generators T1 to T10 includes the outer circumferential surface, the inner circumferential surface, and the internal flow passage that is partitioned by the inner circumferential surface. Each of tubular thermoelectric generators T1 to T10 is configured such that the electromotive force is generated in the axial direction of each of tubular thermoelectric generators T by the temperature difference between the inner circumferential surface and the outer circumferential surface. That is, the power can be taken out from tubular thermoelectric generators T1 to T10 by providing the temperature difference between the outer circumferential surface and the inner circumferential surface in each of tubular thermoelectric generators T1 to T10. For example, the high-temperature medium is brought into contact with the internal flow passage of each of tubular thermoelectric generators T1 to T10, and the low-temperature medium is brought into contact with the outer circumferential surface of each of tubular thermoelectric generators T1 to T10, which allows the power to be taken out from tubular thermoelectric generators T1 to T10. Alternatively, the low-temperature medium may be brought into contact with the inner circumferential surface of each of tubular thermoelectric generators T1 to T10, and the high-temperature medium may be brought into contact with the outer circumferential surface of each of tubular thermoelectric generators T1 to T10.

In FIG. 3B, the medium in contact with the outer circumferential surfaces of tubular thermoelectric generators T1 to T10 in vessel 30 and the medium in contact with the inner circumferential surfaces of tubular thermoelectric generators T1 to T10 in the internal flow passages of tubular thermoelectric generators T1 to T10 are supplied through different pieces of piping (not illustrated), and are separated from each other so as not to be mixed.

Figure 4:
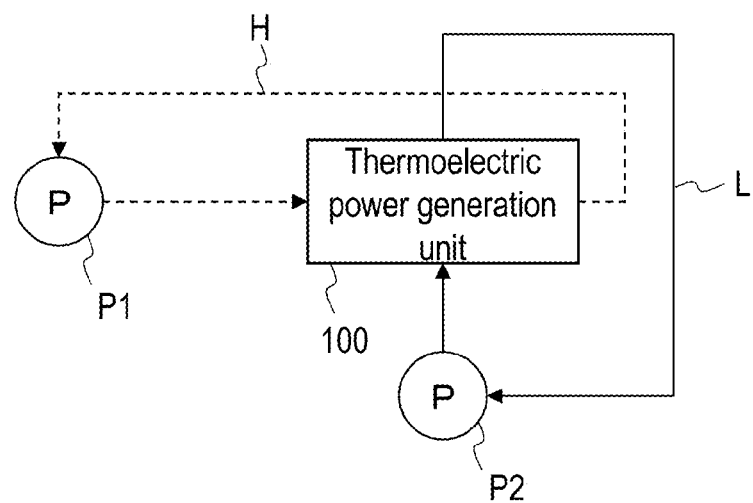
FIG. 4 is a block diagram illustrating an example of a configuration providing a temperature difference between an outer circumferential surface and an inner circumferential surface of the tubular thermoelectric generator of the present disclosure.

FIG. 4 is a block diagram illustrating an example of a configuration providing the temperature difference between the outer circumferential surface and inner circumferential surface of tubular thermoelectric generator T. Arrow H illustrated by a broken line in FIG. 4 schematically indicates a flow of the high-temperature medium, and arrow L illustrated by a solid line schematically indicates a flow of the low-temperature medium. In the example of FIG. 4, the high-temperature medium and the low-temperature medium are circulated by pumps P1 and P2. For example, the high-temperature medium is supplied to the internal flow passage of each of tubular thermoelectric generators T1 to T10, and the low-temperature medium is supplied to the inside of vessel 30. Although not illustrated in FIG. 4, the heat is supplied to the high-temperature medium from a high-temperature heat source (not illustrated) (for example, heat exchanger) while the heat is supplied to a low-temperature heat source (not illustrated) from the low-temperature medium. Vapor, hot water, and emission gas, which have relatively low temperature (for example, 200° C. or less) and are conventionally abandoned into a surrounding environment, can be used as the high-temperature heat source. A heat source having higher temperature may be used as the high-temperature heat source.

In the example of FIG. 4, the high-temperature medium and the low-temperature medium are circulated by pumps P1 and P2. However, the thermoelectric power generation unit of the present disclosure is not limited to the example in FIG. 4. One of or both the high-temperature medium and the low-temperature medium may be abandoned into the surrounding environment from the heat sources without constituting a circulating system. For example, high-temperature hot spring water gushing from the earth may be provided to thermoelectric power generation unit 100 as the high-temperature medium, and then used in application other than the power generation as the hot spring water in which the temperature is lowered, or directly abandoned. As to the low-temperature medium, groundwater, river water, seawater may be pumped up and provided to thermoelectric power generation unit 100. After used as the low-temperature medium, temperatures of the groundwater, river water, seawater may be lowered to a proper level as needed basis, and returned to an original water source or abandoned into the surrounding environment.

Referring to FIG. 3B, in thermoelectric power generation unit 100 according to one aspect of the present disclosure, the plurality of tubular thermoelectric generators T are electrically connected to one another via conductive members J. In FIG. 3B, two tubular thermoelectric generators T disposed adjacent to each other are connected to each other by each conductive member J. The plurality of tubular thermoelectric generators T are electrically connected in series as a whole. For example, right end portions of two tubular thermoelectric generators T3 and T4 viewed on the front side in FIG. 3B are connected to each other by conductive member J3. On the other hand, left end portions of two tubular thermoelectric generators T3 and T4 are connected to tubular thermoelectric generators T2 and T5 by conductive members J2 and J4, respectively.

Figure 5:
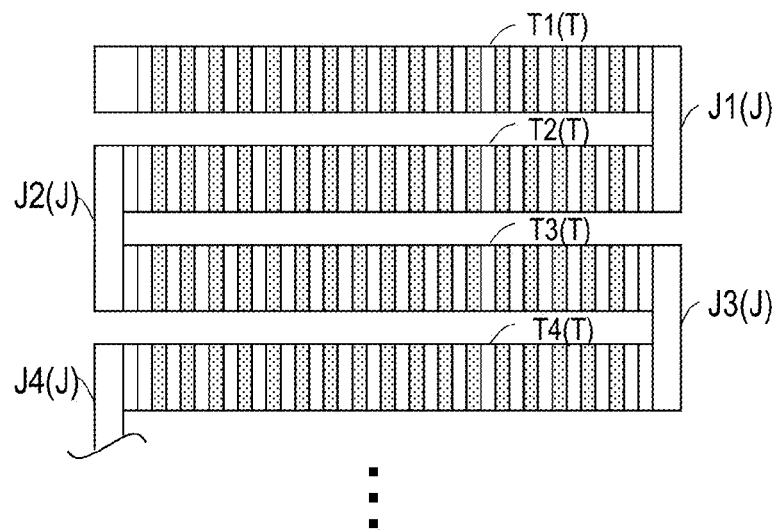
FIG. 5 is a view schematically illustrating an example of electric connection among the tubular thermoelectric generators.
Figure 5:
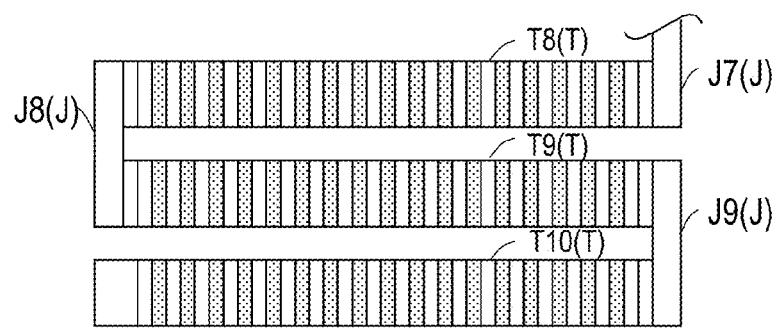

FIG. 5 schematically illustrates an example of electric connection among tubular thermoelectric generators T1 to T10. As illustrated in FIG. 5, each of conductive members J1 to J9 electrically connects the two tubular thermoelectric generators. Conductive members J1 to J9 are arrayed so as to electrically connect tubular thermoelectric generators T1 to T10 in series with one another as a whole. In the example of FIG. 5, a circuit constructed with tubular thermoelectric generators T1 to T10 and conductive members J1 to J9 is traversable. The circuit may partially include the parallel-connected tubular thermoelectric generator, but the circuit is not necessarily traversable.

In the example of FIG. 5, for example, the current flows from tubular thermoelectric generator T1 to tubular thermoelectric generator T10. The current may flow from tubular thermoelectric generator T10 to tubular thermoelectric generator T1. An orientation of the current depends on the kind of the thermoelectric material used in the tubular thermoelectric generator T, an orientation of a heat flow generated between the inner circumferential surface and outer circumferential surface of the tubular thermoelectric generator T, and the direction of the tilt of the stacking plane in tubular thermoelectric generator T. The connection among tubular thermoelectric generators T1 to T10 is decided such that the electromotive forces generated in tubular thermoelectric generators T1 to T10 are not canceled but overlapped.

The orientation of the current passing through tubular thermoelectric generators T1 to T10 has no relation with the flow direction of the medium (high-temperature medium or low-temperature medium) flowing in the internal flow passages of tubular thermoelectric generators T1 to T10. For example, in the example of FIG. 5, the medium may flow in the internal flow passages of tubular thermoelectric generators T1 to T10 from the left side toward the right side.

<Detailed Configuration of Tubular Thermoelectric Generator T>

Figure 6A:
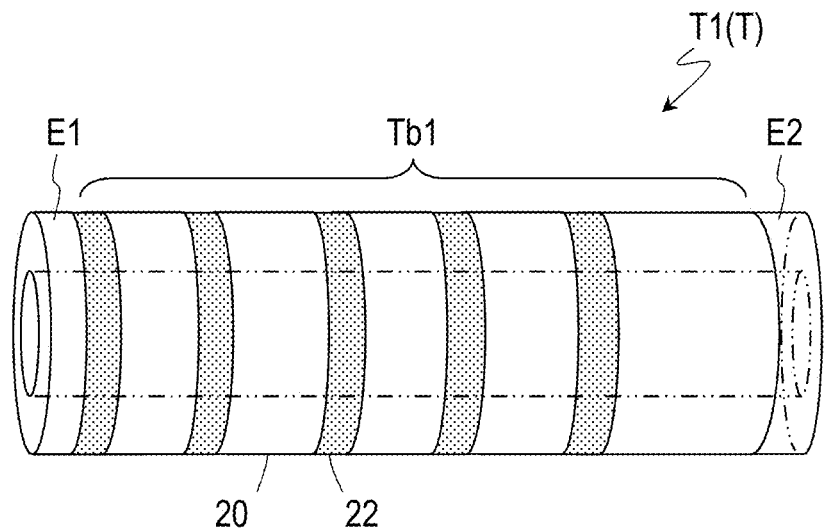
FIG. 6A is a perspective view illustrating one (in this case, the tubular thermoelectric generator) of the tubular thermoelectric generators included in the thermoelectric power generation system.

The detailed configuration of tubular thermoelectric generator T will be described with reference to FIGS. 6A and 6B. FIG. 6A is a perspective view illustrating one (in this case, tubular thermoelectric generator T1) of tubular thermoelectric generators T included in thermoelectric power generation system 100. Tubular thermoelectric generator T1 includes tube body Tb1 and first and second electrodes E1 and E2 that are provided at both ends of tube body Tb1. Tube body Tb1 has a configuration in which metallic layers 20 and thermoelectric material layers 22 are alternately stacked. Hereinafter, sometimes a direction of a straight line connecting first electrode E1 and second electrode E2 is referred to as a "stacking direction". The "stacking direction" agrees with the axial direction of the tubular thermoelectric generator.

Figure 6B:
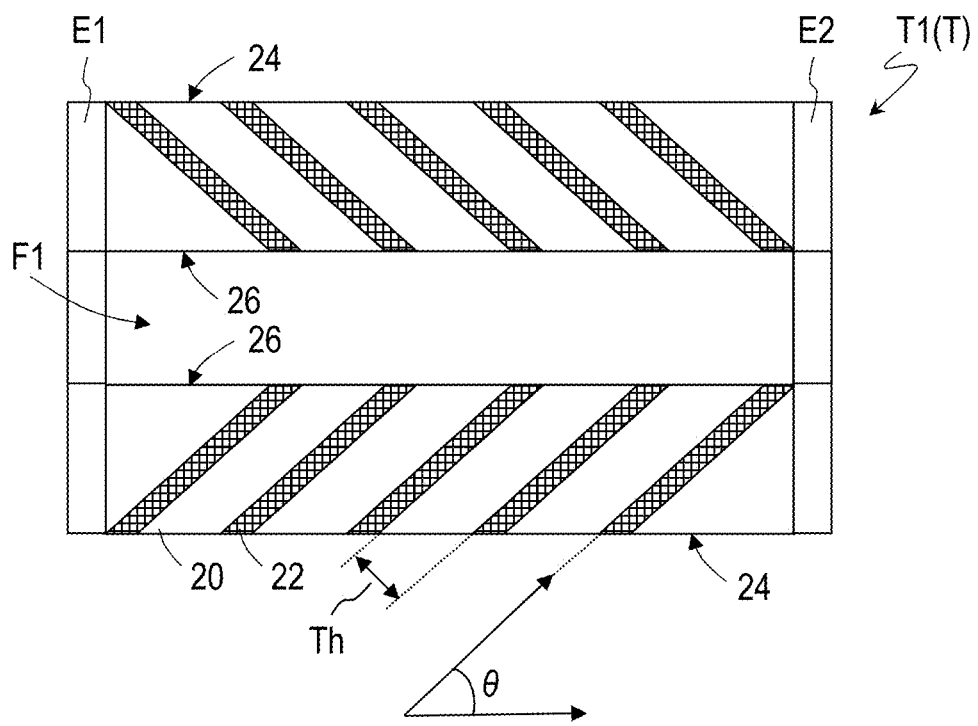
FIG. 6B is a view illustrating a section when the tubular thermoelectric generator is cut along a plane including an axis (center axis) of the tubular thermoelectric generator.

FIG. 6B illustrates a section when tubular thermoelectric generator T1 is cut along a plane including an axis (center axis) of tubular thermoelectric generator T1. As illustrated in FIG. 6B, tubular thermoelectric generator T1 includes outer circumferential surface 24 and inner circumferential surface 26. An area partitioned by inner circumferential surface 26 constitutes flow passage F1. In FIG. 6, outer circumferential surface 24 and inner circumferential surface 26 have circular shapes in the section perpendicular to the axial direction. As described above, alternatively the shapes of outer circumferential surface 24 and inner circumferential surface 26 may be an ellipse and a polygon. There is no particular limitation to a sectional area of the flow passage when the flow passage is cut in the plane perpendicular to the axial direction. The sectional area of the flow passage or the number of tubular thermoelectric generators may properly be set according to a flow rate of the medium supplied to the internal flow passage of tubular thermoelectric generator T.

In FIG. 6, first electrode E1 and second electrode E2 have cylindrical shapes. However, first electrode E1 and second electrode E2 are not limited to the shapes in FIG. 6. Each of first electrode E1 and second electrode E2 is electrically connected to at least one of metallic layer 20 and thermoelectric material layer 22 at both ends of or near tube body Tb1, and has any shape that does not close flow passage F1. In FIGS. 6A and 6B, the outer circumferential surfaces of first electrode E1 and second electrode E2 are flush with outer circumferential surface 24 of tube body Tb1. However, the outer circumferential surfaces of first electrode E1 and second electrode E2 are not necessarily flush with outer circumferential surface 24 of tube body Tb1. For example, diameters (outer diameters) of the outer circumferential surfaces of first electrode E1 and second electrode E2 may be larger or smaller than a diameter (outer diameter) of outer circumferential surface 24 of tube body Tb1. In the plane perpendicular to the axial direction, the sectional shapes of the outer circumferential surfaces of first electrode E1 and second electrode E2 may differ from the sectional shapes of outer circumferential surface 24 of tube body Tb1.

First electrode E1 and second electrode E2 are made of a conductive material, typically metal. First electrode E1 and second electrode E2 may be constructed with one or the plurality of metallic layer 20 located at both end of or near tube body Tb1. In such cases, a part of tube body Tb1 acts as first electrode E1 and second electrode E2. Alternatively, first electrode E1 and second electrode E2 may be constructed with a metallic layer or a bracelet-shape metallic member, which is provided so as to partially cover the outer circumferential surface of tube body Tb1, or a pair of metallic members that is partially fitted in flow passage F1 from both the end of tube body Tb1 so as to come into contact with the inner circumferential surface of tube body Tb1.

As illustrated in FIG. 6B, metallic layers 20 and thermoelectric material layers 22 are alternately stacked with being tilted. Basically the tubular thermoelectric generator having the configuration is operated by the same principle as that in FIGS. 1A, 1B, and 2. Accordingly, the potential difference is generated between first electrode E1 and second electrode E2 when the temperature difference is provided between outer circumferential surface 24 of tubular thermoelectric generator T1 and inner circumferential surface 26 of the tubular thermoelectric generator. At this point, the substantial direction of the temperature gradient is a radial direction (a direction perpendicular to the stacking direction) of tubular thermoelectric generator T1.

For example, a tilt angle (hereinafter, simply referred to as a "tilt angle") θ of the stacking plane in tube body Tb1 can be set in a range of 5° to 60°. The tilt angle θ may range from 20° to 45°. The proper range of the tilt angle θ depends on a combination of the material constituting metallic layer 20 and the thermoelectric material constituting thermoelectric material layer 22.

For example, in tube body Tb1, a ratio (hereinafter simply referred to as a "stacking ratio") of a thickness of metallic layer 20 and a thickness of thermoelectric material layer 22 can be set in a range of 20:1 to 1:9. As used herein, the thickness of metallic layer 20 means a thickness (in FIG. 6B, a thickness indicated by arrow Th) in the direction perpendicular to the stacking plane. Similarly, the thickness of thermoelectric material layer 22 means a thickness in the direction perpendicular to the stacking plane. The number of stacked metallic layers 20 and thermoelectric material layers 22 can properly be set.

Metallic layer 20 can be made of any metallic material. For example, metallic layer 20 can be made of nickel or cobalt. Nickel and cobalt are examples of the metallic material exerting a high thermoelectric power generation characteristic. Metallic layer 20 may contain silver or gold. Metallic layer 20 may contain the metallic material in a singular or alloy state. In the case where metallic layer 20 is made of an alloy, the alloy may contain copper, chromium, or aluminum. Constantan, chromel, and alumel can be cited as an example of the alloy.

Thermoelectric material layer 22 can be made of any thermoelectric material according to an operating temperature. Examples of the thermoelectric material used in thermoelectric material layer 22 include a thermoelectric material containing a single element such as bismuth and antimony, an alloy thermoelectric material such as a BiTe system, a PbTe system, and a SiGe system, and an oxide thermoelectric material such as $Ca_xCoO_2$, $Na_xCoO_2$, and $SrTiO_3$. As used herein, the "thermoelectric material" means a material having a Seebeck coefficient of an absolute value of 30 μV/K or more and electric resistivity of 10 mΩcm or less. The thermoelectric material may be either crystal or amorphous. In the case where the high-temperature medium has temperatures of about 200° C. or less, for example, thermoelectric material layer 22 can be made of a dense body of bismuth-antimony-tellurium. Although a typical chemical composition of bismuth-antimony-tellurium is $Bi_{0.5}Sb_{1.5}Te_3$, the typical chemical composition is not limited to $Bi_{0.5}Sb_{1.5}Te_3$. Bismuth-antimony-tellurium may contain a dopant such as selenium. A composition ratio of bismuth and antimony can properly be adjusted.

Bismuth telluride and lead telluride can be cited as another example of the thermoelectric material constituting thermoelectric material layer 22. In the case where thermoelectric material layer 22 is made of bismuth telluride, assuming that $Bi_2Te_X$ is a chemical composition of bismuth telluride, bismuth telluride may be used when a condition of 2<X<4 is satisfied. A typical chemical composition of bismuth telluride is $Bi_2Te_3$. $Bi_2Te_3$ can contain antimony or selenium. The chemical composition of bismuth telluride containing antimony is expressed by $(Bi_{1-y}Sb_y)_2Te_X$. At this point, bismuth telluride containing antimony may be used when a condition of 0<Y<1 is satisfied, more preferably a condition of 0.6<Y<0.9 is satisfied.

Any material having excellent conductivity can be used as the material constituting first electrode E1 and second electrode E2. First electrode E1 and second electrode E2 can be made of metals such as copper, silver, molybdenum, tungsten, aluminum, titanium, chromium, gold, platinum, and indium. Alternatively, first electrode E1 and second electrode E2 may be made of nitrides or oxides such as a titanium nitride (TiN), tin-doped indium oxide (ITO), and tin oxide ($SnO_2$). First electrode E1 or second electrode E2 may be made of solder, silver solder, and a conductive paste. In the case where both the ends of tube body Tb1 are constructed with metallic layer 20, as described above, metallic layers 20 can be used as first electrode E1 and second electrode E2.

The element having the configuration in which the metallic layers and the thermoelectric material layers are alternately stacked is described above as the typical example of the tubular thermoelectric generator. However, the structure of the tubular thermoelectric generator that can be used in the present disclosure is not limited to the above configuration. When a first layer made of a first material relatively having the low Seebeck coefficient and the high thermal conductivity and a second layer made of a second material relatively having the high Seebeck coefficient and the low thermal conductivity are stacked, the above thermoelectric power generation can be achieved. Metallic layer 20 and thermoelectric material layer 22 are examples of the first layer and the second layer.

<One Aspect of Thermoelectric Power Generation Unit>

Figure 7A:
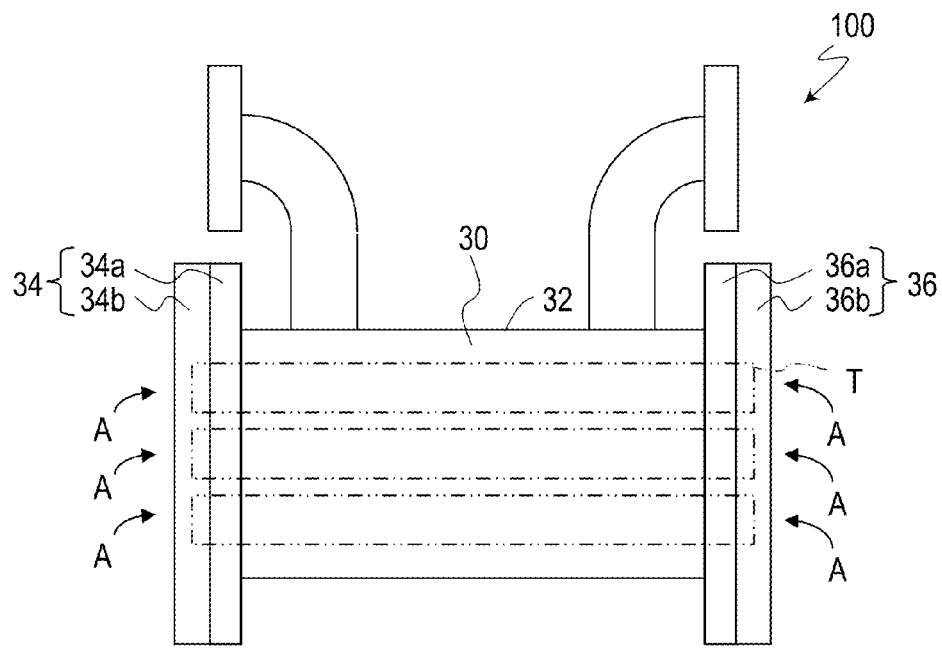
FIG. 7A is a front view illustrating one aspect of a thermoelectric power generation unit of the present disclosure.
Figure 7B:
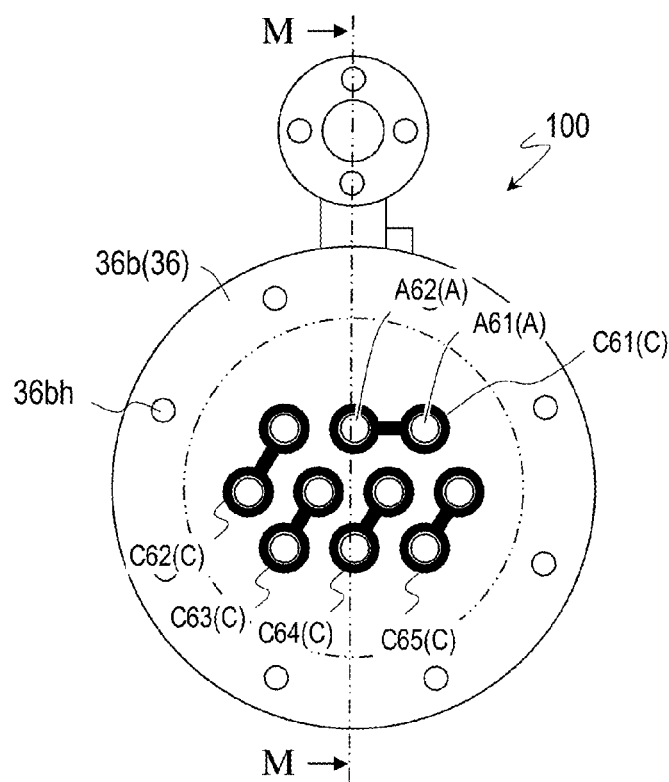
FIG. 7B is a view illustrating one (in this case, a right side view) of side surfaces of the thermoelectric power generation unit.

Referring to FIGS. 7A and 7B, FIG. 7A is a front view illustrating one aspect of the thermoelectric power generation unit of the present disclosure, and FIG. 7B is a view illustrating one of side surfaces (in this case, a right side view) of thermoelectric power generation unit 100. As illustrated in FIG. 7A, one aspect of thermoelectric power generation unit 100 includes the plurality of tubular thermoelectric generators T and vessel 30 in which the plurality of tubular thermoelectric generators T are accommodated. The structure in FIG. 7A is seemingly similar to a "shell and tube structure" of the heat exchanger. However, in the heat exchanger, the plurality of tubes act simply as conduits in which the fluids flow, but the electric connection is not required. In thermoelectric power generation system of the present disclosure, from the practical viewpoint, it is necessary to stably achieve the electric connection between the tubes, while the electric connection is not required in the heat exchanger.

As described above with reference to FIG. 4, the high-temperature medium and the low-temperature medium are supplied to thermoelectric power generation unit 100. For example, the high-temperature medium is supplied to the internal flow passage of each of tubular thermoelectric generators T1 to T10 through a plurality of openings A. On the other hand, the low-temperature medium is supplied to the inside of vessel 30 through fluid inlet 38a. Therefore, the temperature difference is provided between the outer circumferential surface and inner circumferential surface of tubular thermoelectric generator T. At this point, in thermoelectric power generation unit 100, heat exchange is performed between the high-temperature medium and the low-temperature medium, and the electromotive force is generated in the axial direction in each of tubular thermoelectric generators T1 to T10.

Vessel 30 of the present disclosure includes cylindrical shell 32 that surrounds tubular thermoelectric generator T and a pair of plates 34 and 36 that is provided so as to close both opened ends of shell 32. More particularly, plate 34 is fixed to the left end of shell 32, and plate 36 is fixed to the right end of shell 32. The plurality of openings A communicating with the flow passage of each of tubular thermoelectric generators T are provided in each of plates 34 and 36, and both end portions of tubular thermoelectric generator T are inserted in the pair of openings A corresponding to plates 34 and 36.

Similarly to a tube sheet in the shell and tube type heat exchanger, plates 34 and 36 have a function of supporting the plurality of tubes (tubular thermoelectric generators T) with the plurality of tubes being spatially separated. However, as described later in detail, plates 34 and 36 in one aspect of the present disclosure have an electric connection function that the tube sheet of the heat exchanger lacks.

Referring to FIG. 7A, plate 34 includes first plate portion 34a that is fixed to shell 32 and second plate portion 34b that is detachably attached to first plate portion 34a. Similarly, plate 36 includes first plate portion 36a that is fixed to shell 32 and second plate portion 36b that is detachably attached to first plate portion 36a. Each of openings A provided in plates 34 and 36 pierces first plate portions 34a and 36a and second plate portions 34b and 36b, and opens the flow passage of tubular thermoelectric generator T to the outside of vessel 30.

Examples of the material constituting vessel 30 include stainless steel, hastelloy (registered trademark), and inconel (registered trademark). Vinyl chloride resin and acrylic resin can be cited as another example of the material constituting vessel 30. Shell 32 and plates 34 and 36 may be made of the same material or different materials. In the case where shell 32 and first plate portions 34a and 36a are made of metal, first plate portions 34a and 36a are fixed to shell 32 by, for example, welding. In the case where flanges are provided at both the ends of shell 32, first plate portions 34a and 36a may be fixed to the flanges.

During operation, because the fluid (low-temperature medium or high-temperature medium) is introduced into vessel 30, it is necessary that air tight or water tight be maintained in vessel 30. As described later, in openings A of plates 34 and 36, sealing is implemented to maintain the air tight or the water tight with the end portions of tubular thermoelectric generator T being inserted. There is no gap between shell 32 and plates 34 and 36, thereby implementing the structure in which the air tight or the water tight is maintained during the operation.

As illustrated in FIG. 7B, ten openings A are provided in plate 36. Similarly, ten openings A are provided in plate 34. In FIGS. 7A and 7B, opening A of plate 34 and opening A of plate 36 are disposed in a mirror symmetric manner, and ten straight lines connecting center points of the pairs of corresponding openings A are parallel to one another. In the configuration, each of tubular thermoelectric generators T can be supported in parallel by the pair of corresponding openings A. In vessel 30, the plurality of tubular thermoelectric generators T are not necessarily parallel to one another, but may be have a "non-parallel" or "twisted" relationship.

As illustrated in FIG. 7B, plate 36 includes channel (hereinafter, sometimes referred to as a "coupling trench") C that is formed so as to couple at least two openings A provided in plate 36. In FIG. 7B, channel C61 couples opening A61 and opening A62. Similarly, each of channels C62 to C65 couples two openings A provided in plate 36. As described later, a conductive member is accommodated in each of channels C61 to C65.

Figure 8:
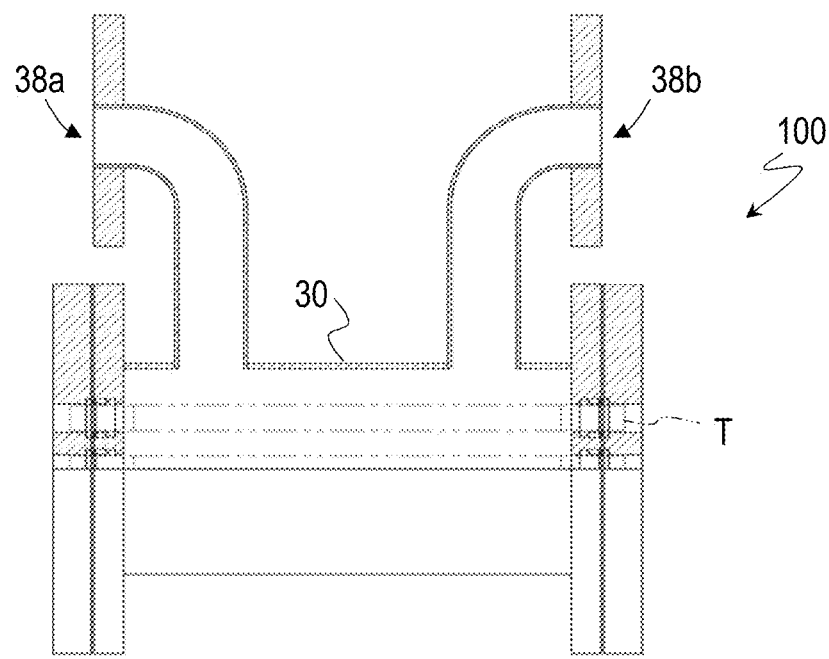
FIG. 8 is a view illustrating part of a section M-M in FIG. 7B.

FIG. 8 illustrates part of a section M-M in FIG. 7B. In FIG. 8, lower half of the section of vessel 30 is not illustrated, but a front surface of vessel 30 is illustrated. As illustrated in FIG. 8, vessel 30 includes fluid inlet 38a and fluid outlet 38b in order to cause the fluid to flow in vessel 30. In thermoelectric power generation unit 100, fluid inlet 38a and fluid outlet 38b are disposed above vessel 30. The disposition of fluid inlet 38a is not limited to the place above vessel 30, but fluid inlet 38a may be disposed, for example, below vessel 30. The same holds true for fluid outlet 38b. It is not necessary that fluid inlet 38a and fluid outlet 38b be fixedly used as the inlet and outlet of the fluid, but the inlet and outlet of the fluid may reversely be used on a regular or irregular base. The flow direction of the fluid is not necessarily fixed. Each of the numbers of fluid inlets 38a and fluid outlets 38b is not limited to one, but the plurality of fluid inlets 38a and/or the plurality of fluid outlets 38b may be provided.

Figure 9:
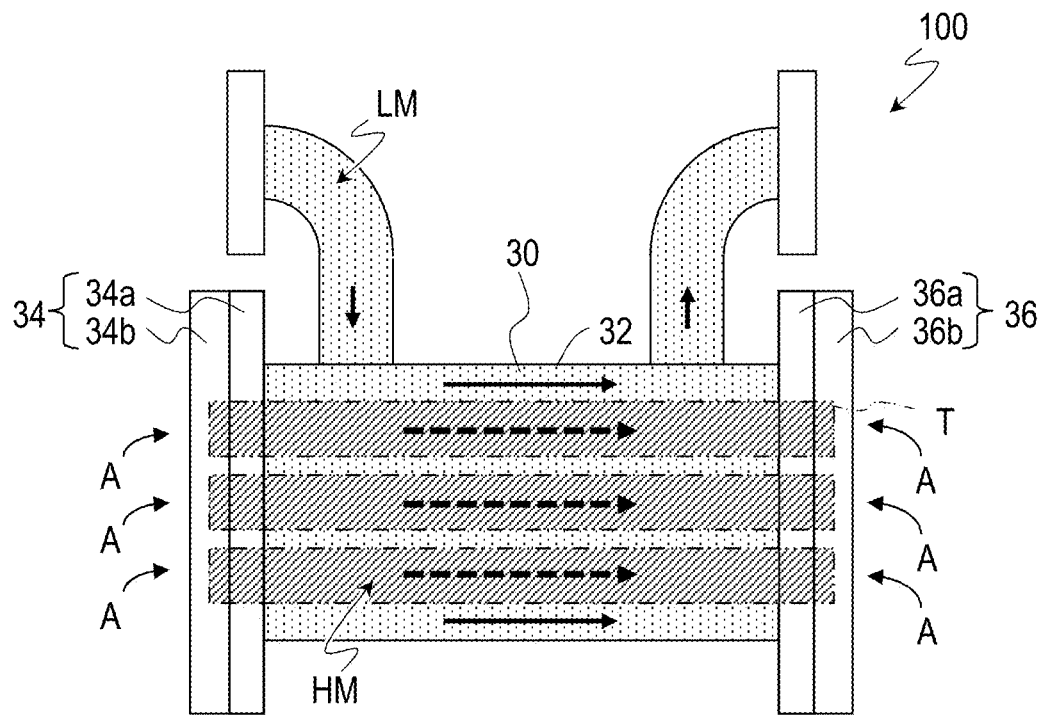
FIG. 9 is a view schematically illustrating an example of flow directions of a high-temperature medium and a low-temperature medium, which are introduced in the thermoelectric power generation unit.

FIG. 9 is a view schematically illustrating an example of the flow directions of the high-temperature and low-temperature mediums introduced in thermoelectric power generation unit 100. In the example of FIG. 9, high-temperature medium HM is supplied to the internal flow passage of each of tubular thermoelectric generators T1 to T10, and low-temperature medium LM is supplied to the inside of vessel 30. In this case, high-temperature medium HM is introduced to the internal flow passage of each of the tubular thermoelectric generators via opening A provided in plate 34. High-temperature medium HM introduced to the internal flow passage of each of the tubular thermoelectric generators comes into contact with the inner circumferential surface of each of the tubular thermoelectric generators. On the other hand, low-temperature medium LM is introduced from fluid inlet 38a to the inside of vessel 30. Low-temperature medium LM introduced to the inside of vessel 30 comes into contact with the outer circumferential surface of each of the tubular thermoelectric generators.

In the example of FIG. 9, high-temperature medium HM performs the heat exchange with low-temperature medium LM while flowing in the internal flow passage of each of the tubular thermoelectric generators. Low-temperature medium HM that performs the heat exchange with low-temperature medium LM to decrease the temperature is discharged to the outside of thermoelectric power generation unit 100 via opening A provided in plate 36. On the other hand, low-temperature medium LM performs the heat exchange with high-temperature medium HM while flowing in vessel 30. Low-temperature medium LM that performs the heat exchange with high-temperature medium HM to increase the temperature is discharged to the outside of thermoelectric power generation unit 100 from fluid outlet 38b. FIG. 9 illustrates the flow directions of high-temperature medium HM and low-temperature medium LM only by way of example. One of or both high-temperature medium HM and low-temperature medium LM may flow from the right side toward the left side in FIG. 9.

In one aspect, high-temperature medium HM (for example, hot water) can be introduced to the flow passage of tubular thermoelectric generator T, and low-temperature medium LM (for example, cooling water) can be introduced from fluid inlet 38a to fill the inside of vessel 30 with low-temperature medium LM. On the other hand, low-temperature medium LM (for example, cooling water) may be introduced to the flow passage of tubular thermoelectric generator T, and high-temperature medium HM (for example, hot water) may be introduced from fluid inlet 38a to fill the inside of vessel 30 with high-temperature medium HM. Thus, the temperature difference necessary for the power generation can be provided between outer circumferential surface 24 and inner circumferential surface 26 in each of tubular thermoelectric generators T.

<Aspect of Sealing for Fluid and Electric Connection Between Tubular Thermoelectric Generators>

Figure 10:
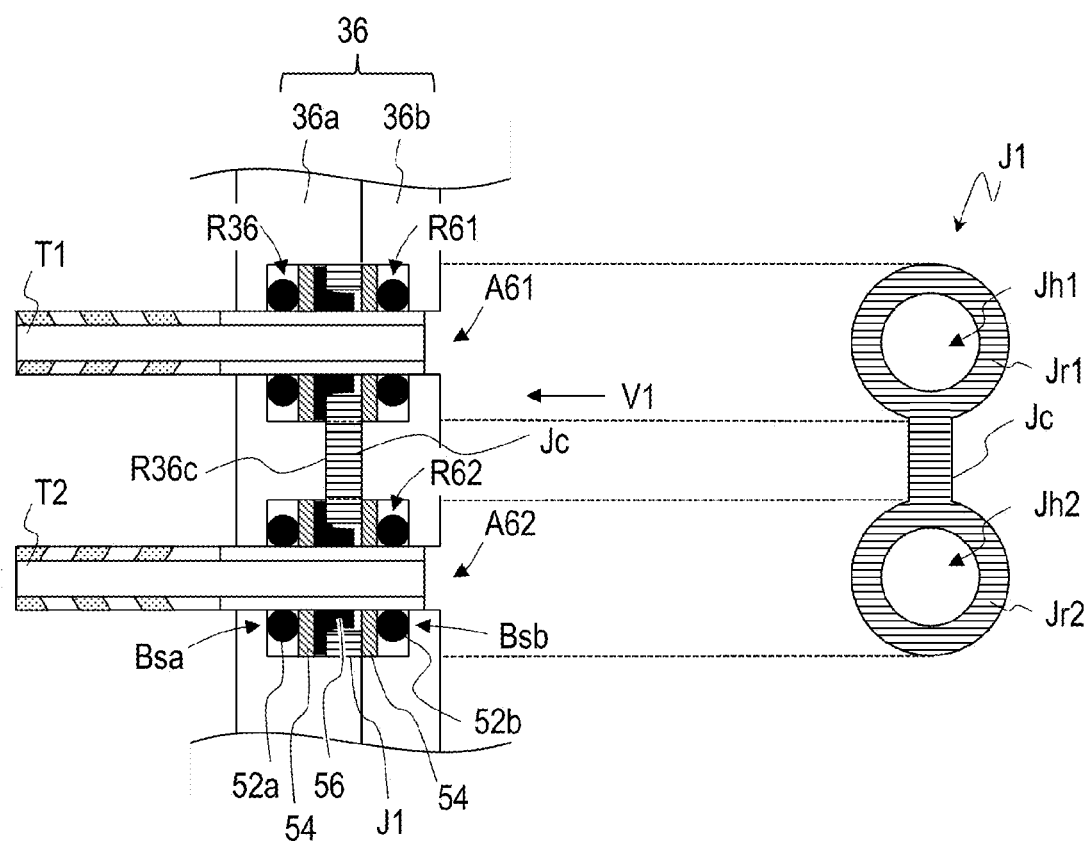
FIG. 10 is a view illustrating a partial section of a plate and an appearance of a conductive member when the conductive member is viewed from a direction indicated by an arrow.

FIG. 10 is a view illustrating a partial section of plate 36 and appearance of conductive member J1. The left side of FIG. 10 schematically illustrates the section when plate 36 is cut in a plane including both the center axes of tubular thermoelectric generator T1 and tubular thermoelectric generator T2. The left side of FIG. 10 illustrates the structure of two openings A61 and A62 and the neighborhood of openings A61 and A62 in the plurality of openings A included in plate 36. The right side of FIG. 10 illustrates an appearance of conductive member J1 when conductive member J1 is viewed from a direction indicated by arrow V1 in the left side of FIG. 10. Conductive member J1 includes two through-holes Jh1 and Jh2. More particularly, conductive member J1 includes first ring portion Jr1 including through-hole Jh1, second ring portion Jr2 including through-hole Jh2, and coupling unit Jc that connects ring portions Jr1 and Jr2.

As illustrated in FIG. 10, the end portion (second electrode side) of tubular thermoelectric generator T1 is inserted in opening A61 of plate 36, and the end portion (first electrode side) of tubular thermoelectric generator T2 is inserted in opening A62. At this point, the end portions of tubular thermoelectric generators T1 and T2 are inserted in through-holes Jh1 and Jh2 of conductive member J1, respectively. The end portion (second electrode side) of tubular thermoelectric generator T1 is electrically connected to the end portion (first electrode side) of tubular thermoelectric generator T2 by conductive member J1. Hereinafter, sometimes the conductive member electrically connecting the two tubular thermoelectric generators is referred to as a "coupling plate".

The shapes of first ring portion Jr1 and second ring portion Jr2 are not limited to the annular shape. Through-holes Jh1 and Jh2 may have a circular, ellipsoidal, or polygonal shape as long as the electric connection can be ensured between the tubular thermoelectric generators. For example, the shape of through-hole Jh1 or Jh2 may differ from the sectional shape of first electrode E1 or second electrode E2 when first electrode E1 or second electrode E2 is cut in the section perpendicular to the axial direction. The term "ring" includes shapes except the annular shape.

Referring to FIG. 10, recess R36 is provided in first plate portion 36a according to openings A61 and A62. Recess R36 includes trench portion R36c that connects opening A61 and opening A62. Coupling unit Jc of conductive member J1 is located in portion R36c. On the other hand, recess R61 corresponding to opening A61 and recess R62 corresponding to opening A62 are provided in second plate portion 36b. In order to implement the sealing and the electric connection, various members are disposed in a space formed by recess R36 and recesses R61 and R62. The space constitutes channel C61 in which conductive member J1 is accommodated, and opening A61 and opening A62 are coupled to each other by channel C61.

Referring to FIG. 10, first O-ring 52a, washer 54, conductive ring-shaped member 56, second O-ring 52b are accommodated in channel C61 in addition to conductive member J1, and the end portions of tubular thermoelectric generators T1 and T2 pierce the holes of these members. First O-ring 52a disposed on the side closer to shell 32 of vessel 30 is in contact with seating surface Bsa formed in first plate portion 36a, thereby implementing the sealing such that the fluid supplied to the inside of shell 32 does not invade in channel C61. On the other hand, second O-ring 52b disposed on the side farther from shell 32 of vessel 30 is in contact with seating surface Bsb formed in second plate portion 36b, thereby implementing the sealing such that the fluid existing outside second plate portion 36b does not invade in channel C61.

O-rings 52a and 52b are annular sealing components having an O-shape (circular shape) in section. O-rings 52a and 52b are made of rubber, metal, or plastic, and have a function of preventing the fluid from flowing in or out through the gap between the components. In FIG. 10, a space communicating with the flow passage of each of tubular thermoelectric generators T is located on the right side of second plate portion 36b, and the fluid constituting the high-temperature medium or low-temperature medium exists in the space. In one aspect of the present disclosure, the electric connection between tubular thermoelectric generators T and the sealing for the fluids constituting the high-temperature medium and low-temperature medium can be implemented using the members in FIG. 10. The structure and function of conductive ring-shaped member 56 are described in detail later.

The configuration similar to that of plate 36 is provided in plate 34. As described above, opening A of plate 34 and opening A of plate 36 are disposed in the mirror symmetric manner. However, in plate 34 and plate 36, the positions where the trench portion connecting two openings A is formed are not disposed in the mirror symmetric manner. The plurality of tubular thermoelectric generators T cannot be connected in series when an array pattern of the conductive member electrically connecting tubular thermoelectric generators T in plate 34 and an array pattern of the conductive member electrically connecting tubular thermoelectric generators T in plate 36 are disposed in the mirror symmetric manner.

As described above, in the case where the plate (for example, plate 36) fixed to shell 32 includes first plate portion (36a) and second plate portion (36b), each of the plurality of openings A in first plate portion (36a) includes first seating surface (Bsa) receiving first O-ring (52a), and each of the plurality of openings A in second plate portion (36b) includes second seating surface (Bsb) receiving second O-ring (52b). However, plates 34 and 36 do not necessarily have the configuration in FIG. 10. For example, plate 36 is not necessarily divided into first plate portion 36a and second plate portion 36b. When conductive member J1 is pressed by another member instead of second plate portion 36b, first O-ring 52a presses first seating surface (Bsa) to implement the sealing.

In FIG. 10, conductive ring-shaped member 56 is interposed between tubular thermoelectric generator T1 and conductive member J1. Similarly, conductive ring-shaped member 56 is interposed between tubular thermoelectric generator T2 and conductive member J1.

Typically, conductive member J1 is made of metal. Examples of the material constituting conductive member J1 include copper (oxygen-free copper), brass, and aluminum. Nickel plating or tin plating may be performed from the viewpoint of corrosion prevention. Insulating coating may partially be applied to conductive member J as long as the electric connection can be ensured between conductive member J (in this case, conductive member J1) and the tubular thermoelectric generators (in this case, tubular thermoelectric generators T1 and T2) inserted in the two through-holes (in this case, through-holes Jh1 and Jh2) of conductive member J. That is, conductive member J may include a main body made of metal and the insulating coating that partially covers the surface of the main body. For example, the insulating coating may be made of resins such as Teflon (registered trademark). In the case where the main body of conductive member J is made of aluminum, an insulating oxide layer may be formed as the insulating coating in part of the surface of the main body.

Figure 11A:
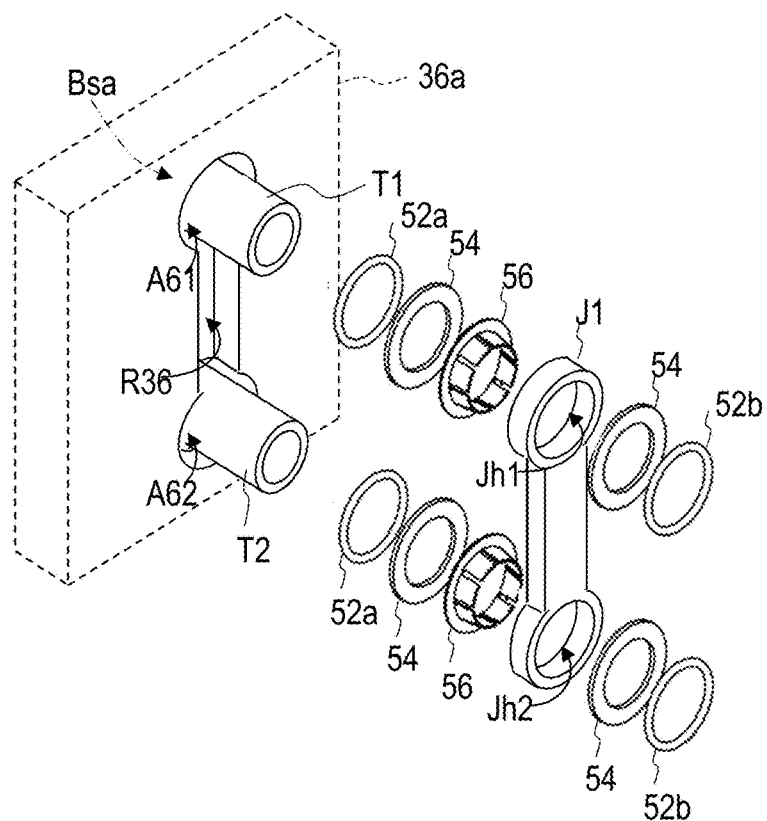
FIG. 11A is an exploded perspective view illustrating a neighborhood of a channel in which the conductive member is accommodated.

FIG. 11A is an exploded perspective view illustrating a neighborhood of channel C61 in which conductive member J1 is accommodated. As illustrated in FIG. 11A, first O-ring 52a, conductive ring-shaped member 56, conductive member J1, and second O-ring 52b are inserted in openings A61 and A62 from the outside of vessel 30. Washer 54 is disposed between first O-ring 52a and conductive ring-shaped member 56 as needed basis. Washer 54 can be disposed between conductive member J1 and second O-ring 52b. Washer 54 is inserted between flat unit 56f of conductive ring-shaped member 56 (to be described) and O-ring 52a (or 54b).

Figure 11B:
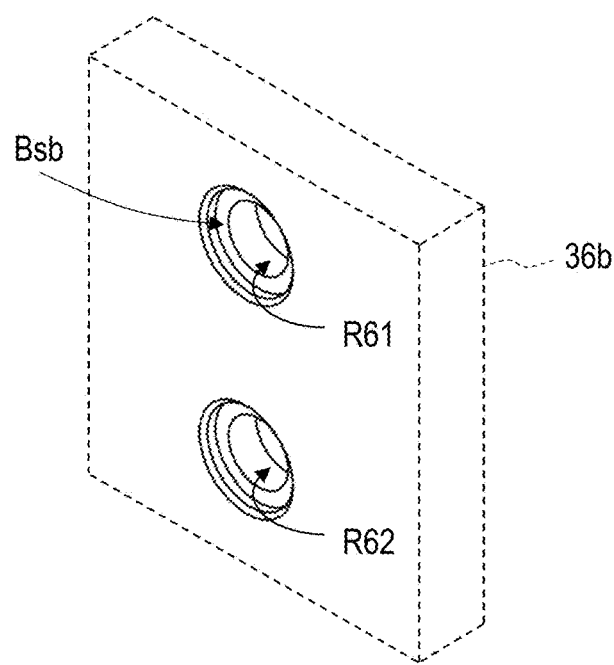
FIG. 11B is a perspective view illustrating portions corresponding to openings in a sealing surface (a surface opposed to a first plate portion) of a second plate portion.

FIG. 11B illustrates portions corresponding to openings A61 and A62 in a sealing surface (the surface opposed to first plate portion 36a) of second plate portion 36b. As described above, openings A61 and A62 in second plate portion 36b include seating surfaces Bsb receiving second O-ring 52b. Accordingly, when first plate portion 36a and second plate portion 36b are coupled to each other by flange connection with the sealing surface of first plate portion 36a and the sealing surface of second plate portion 36b being opposed to each other, first O-ring 52a in first plate portion 36a can be pressed against seating surface Bsa. More particularly, second seating surface Bsb presses first O-ring 52a against seating surface Bsa with second O-ring 52b, conductive member J1, and conductive ring-shaped member 56 being interposed therebetween. Therefore, conductive member J1 can be sealed from the high-temperature medium and the low-temperature medium.

In the case where first plate portion 36a and second plate portion 36b are made of conductive materials such as metal, sealing-side surfaces of first plate portion 36a and second plate portion 36b can be coated with an insulating material. In first plate portion 36a and second plate portion 36b, the area in contact with conductive member J during the operation can be coated so as to be electrically insulated from conductive member J. In one aspect, for example, a fluorine resin coating can be formed on the sealing-side surfaces of first plate portion 36a and second plate portion 36b by fluorine spray.

<Detailed Configuration of Conductive Ring-Shaped Member>

The configuration of conductive ring-shaped member 56 will be described below with reference to FIGS. 12A and 12B.

Figure 12A:
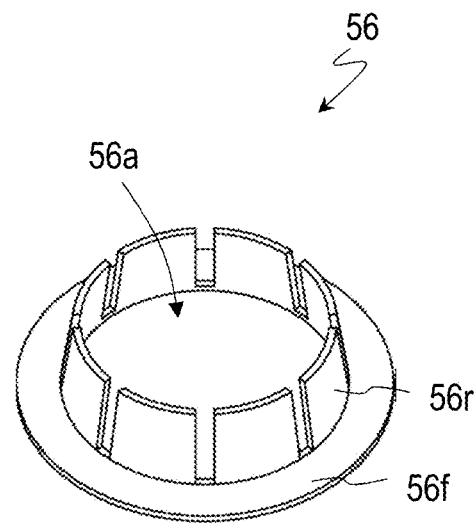
FIG. 12A is a perspective view illustrating an exemplary shape of a conductive ring-shaped member.

FIG. 12A is a perspective view illustrating an exemplary shape of conductive ring-shaped member 56. Conductive ring-shaped member 56 in FIG. 12A includes ring-shaped flat unit 56f and a plurality of elastic units 56r. Flat unit 56f includes through-hole 56a. Each of the plurality of elastic units 56r is projected from a rim of through-hole 56a in flat unit 56f, and biased toward the center of through-hole 56a by an elastic force. Conductive ring-shaped member 56 can easily be prepared by forming one metallic plate (for example, thicknesses of 0.1 mm to several millimeters). Similarly, conductive member J can easily be prepared by forming one metallic plate metallic plate (for example, thicknesses of 0.1 mm to several millimeters).

The end portion (first electrode or second electrode) of tubular thermoelectric generator T is inserted in through-hole 56a of conductive ring-shaped member 56. Therefore, the shape and size of through-hole 56a of ring-shaped flat unit 56f are designed to be matched with the shape and size of the outer circumferential surface in the end portion (first electrode or second electrode) of tubular thermoelectric generator T.

Figure 13A:
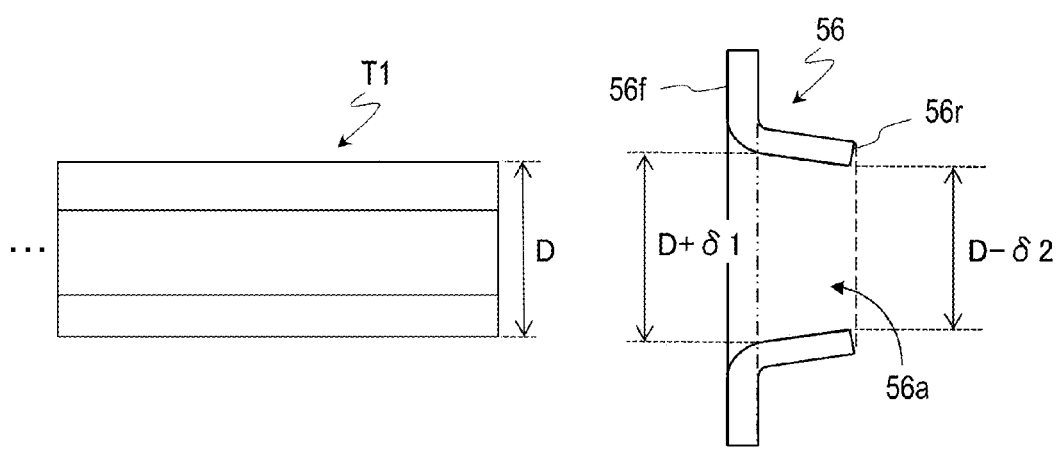
FIG. 13A is a sectional view illustrating the conductive ring-shaped member and the tubular thermoelectric generator.
Figure 13B:
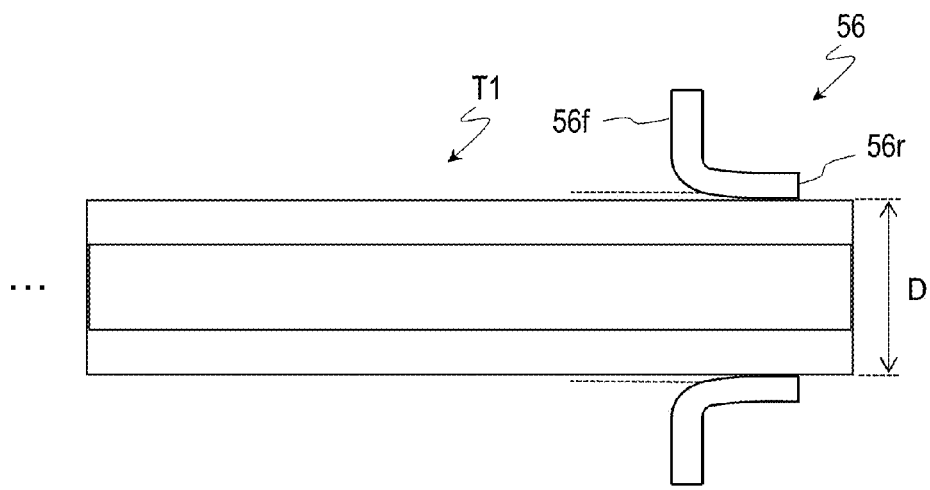
FIG. 13B is a sectional view illustrating a state in which an end portion of the tubular thermoelectric generator is inserted in the conductive ring-shaped member.
Figure 13C:
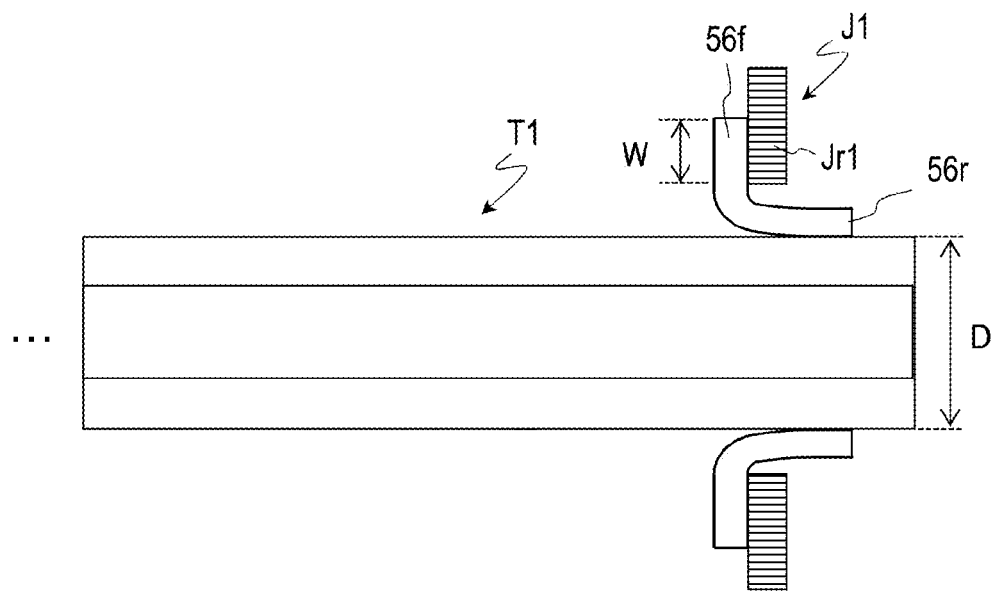
FIG. 13C is a sectional view illustrating a state in which the end portion of the tubular thermoelectric generator is inserted in the conductive ring-shaped member and the conductive member.

The shape of conductive ring-shaped member 56 will be described in detail with reference to FIGS. 13A, 13B, and 13C. FIG. 13A is a sectional view illustrating conductive ring-shaped member 56 and part of tubular thermoelectric generator T1. FIG. 13B is a sectional view illustrating a state in which an end portion of tubular thermoelectric generator T1 is inserted in conductive ring-shaped member 56. FIG. 13C is a sectional view illustrating a state in which the end portion of tubular thermoelectric generator T1 is inserted in conductive ring-shaped member 56 and the through-hole of conductive member J1. FIGS. 13A, 13B, and FIG. 13C illustrate the section when tubular thermoelectric generator T1 is cut along the plane including the axis (center axis) of tubular thermoelectric generator T1.

As illustrated in FIG. 13A, for example, it is assumed that the outer circumferential surface in the end portion (first electrode or second electrode) of tubular thermoelectric generator T1 is a cylindrical surface having diameter D. In this case, through-hole 56a of conductive ring-shaped member 56 is made so as to have a circular shape having diameter $D+\delta 1$ ($\delta 1>0$) through which the end portion of tubular thermoelectric generator T1 can pass. On the other hand, each of the plurality of elastic units 56r is formed so as to be biased toward the center of through-hole 56a by the elastic force. As illustrated in FIG. 13A, for example, each of the plurality of elastic units 56r is formed so as to be tilted toward the center of through-hole 56a. That is, elastic unit 56r is formed so as to be circumscribed to a cylindrical outer circumferential surface (having diameter $D-\delta 2(\delta 2>0)$) having a sectional diameter smaller than diameter D unless an external force is applied to elastic unit 56r.

Because of a relationship of $D+\delta 1>D>D-\delta 2$, when the end portion of tubular thermoelectric generator T1 is inserted in through-hole 56a, each of the plurality of elastic units 56r is in physical contact with the outer circumferential surface in the end portion of tubular thermoelectric generator T1 as illustrated in FIG. 13B. At this point, because each of the plurality of elastic units 56r is biased toward the center of through-hole 56a by the elastic force, each of the plurality of elastic units 56r presses the outer circumferential surface in the end portion of tubular thermoelectric generator T1 with the elastic force. Thus, the outer circumferential surface of tubular thermoelectric generator T1 inserted in through-hole 56a stably implements the physical and electric contact with the plurality of elastic units 56r.

Referring to FIG. 13C, conductive member J1 is in contact with flat unit 56f of conductive ring-shaped member 56 in openings A provided in plates 34 and 36. More particularly, when conductive ring-shaped member 56 and conductive member J1 are attached to the end portion of tubular thermoelectric generator T1, the surface of flat unit 56f of conductive ring-shaped member 56 comes into contact with the surface of ring portion Jr1 of conductive member J1 as illustrated in FIG. 13C. Thus, in one aspect of the present disclosure, the electric connection between conductive ring-shaped member 56 and conductive member J1 is achieved by the contact of the planes with each other. A contact area enough to pass the current generated by tubular thermoelectric generator T1 can be ensured because the plane of conductive ring-shaped member 56 is in contact with the plane of conductive member J1. Width W of flat unit 56f can properly be set such that the contact area enough to pass the current generated by tubular thermoelectric generator T1 is obtained. The surface of flat unit 56f or the surface of ring portion Jr1 of conductive member J1 may irregularly be formed as long as the contact area between conductive ring-shaped member 56 and conductive member J1 is ensured. For example, the irregular shape formed in the surface of flat unit 56f and the irregular shape corresponding to the irregular shape formed in the surface of flat unit 56f are formed in the surface of ring portion Jr1 of conductive member J1, which allows the larger contact area to be ensured.

Figure 14A:
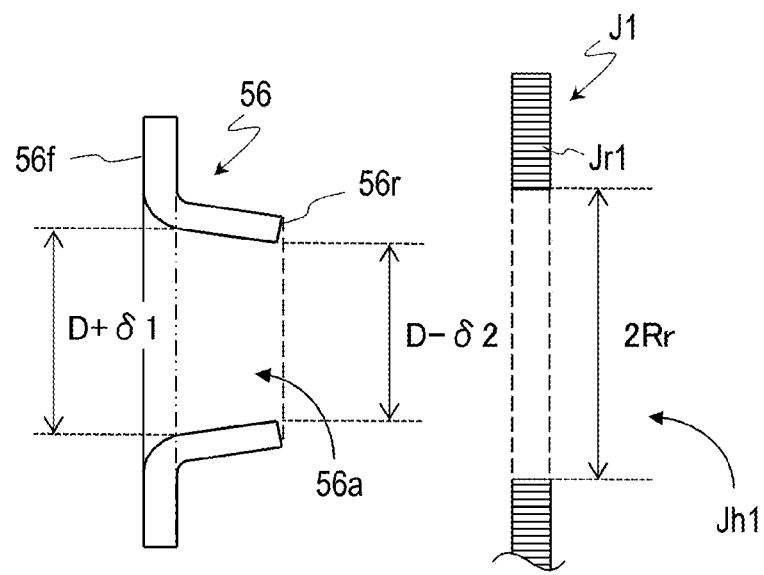
FIG. 14A is a sectional view illustrating the conductive ring-shaped member and part of the conductive member.
Figure 14B:
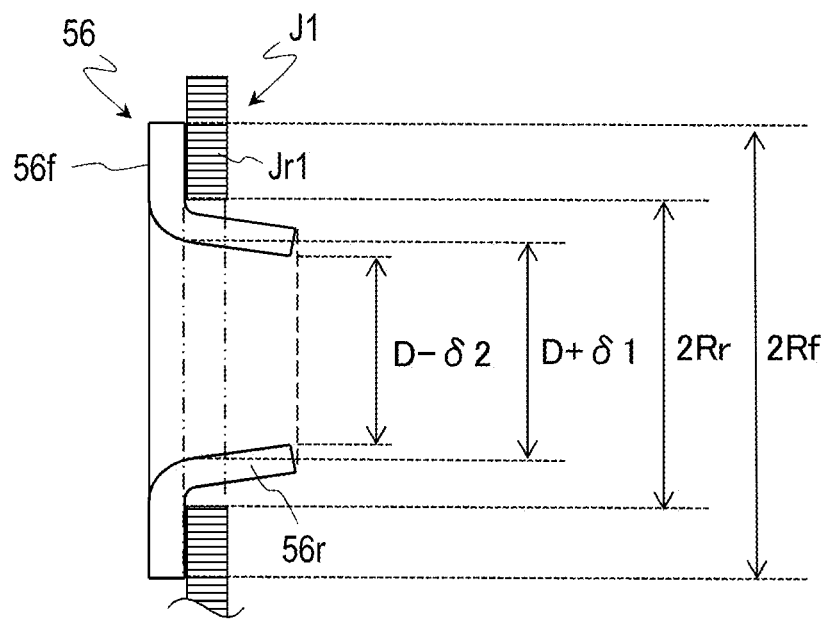
FIG. 14B is a sectional view illustrating a state in which an elastic unit of the conductive ring-shaped member is inserted in a through-hole of conductive member.

Referring to FIGS. 14A and 14B, FIG. 14A is a sectional view illustrating conductive ring-shaped member 56 and part of conductive member J1. FIG. 14B is a sectional view illustrating a state in which elastic unit 56r of conductive ring-shaped member 56 is inserted in through-hole Jh1 of conductive member J1. FIGS. 14A and 14B illustrate the section when conductive ring-shaped member 56 and conductive member J1 are cut along the plane including the axis (center axis) of tubular thermoelectric generator T1.

At this point, assuming that the through-hole (in this case, through-hole Jh1) of conductive member J has diameter 2Rr, in order that the end portion of tubular thermoelectric generator T1 can pass through the through-hole, the through-hole of conductive member J is made such that condition D<2Rr is satisfied. Assuming that flat unit 56f of conductive ring-shaped member 56 has diameter 2Rf, in order that the surface of flat unit 56f comes surely into contact with the surface of ring portion Jr1, the through-hole of conductive member J is made such that condition 2Rr<2Rf is satisfied.

Figure 15:
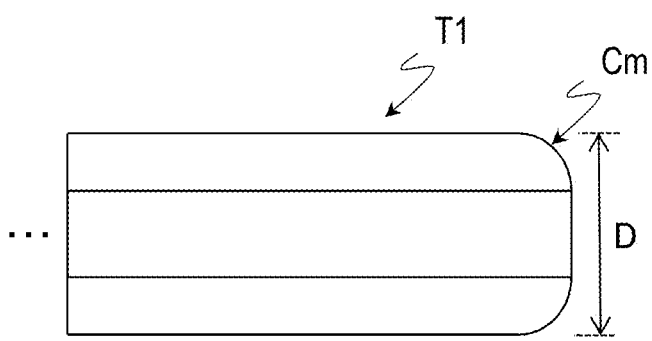
FIG. 15 is a sectional view illustrating the tubular thermoelectric generator including a chamfered portion in the end portion thereof.

As illustrated in FIG. 15, chamfered portion Cm may be formed in the end portion of tubular thermoelectric generator T. When conductive ring-shaped member 56 is inserted in the end portion of tubular thermoelectric generator T1, for example, sometimes elastic unit 56r of conductive ring-shaped member 56 comes into contact with the end portion of tubular thermoelectric generator T to damage the end portion of tubular thermoelectric generator T. The damage caused by the contact of elastic unit 56r with the end portion of tubular thermoelectric generator T can be constrained when tubular thermoelectric generator T includes chamfered portion Cm in the end portion thereof. Conductive member J1 is more surely sealed from the high-temperature medium and the low-temperature medium by constraining the damage of the end portion of tubular thermoelectric generator T. An electric contact failure is reduced between the outer circumferential surface of tubular thermoelectric generator T1 and elastic unit 56r. Chamfered portion Cm may have a curved or planar shape as illustrated in FIG. 15.

The surfaces of conductive ring-shaped member 56 and conductive member J may be subjected to plating using the same kind of metal. For example, when the surfaces of conductive ring-shaped member 56 and conductive member J are subjected to nickel plating, the contact between conductive ring-shaped member 56 and conductive member J can be achieved by the same metal. Therefore, an electric loss is reduced between conductive ring-shaped member 56 and conductive member J. In this case, at least the portion (for example, the surface of flat unit 56f and the surface of the ring portion of the conductive member) in which conductive ring-shaped member 56 and conductive member J are in contact with each other may be plated.

Thus, conductive member J1 is electrically connected to the outer circumferential surface in the end portion of tubular thermoelectric generator T via conductive ring-shaped member 56. In one aspect of the present disclosure, by coupling first plate portion 36a and second plate portion 36b, the electric contact between flat unit 56f of conductive ring-shaped member 56 and conductive member J can stably be implemented, and the sealing can also be implemented.

Additionally, conductive member J1 can more surely be sealed by disposing conductive ring-shaped member 56 in accordance with the end portion of tubular thermoelectric generator T. As described above, first O-ring 52a is pressed against seating surface Bsa with conductive member J1 and conductive ring-shaped member 56 being interposed therebetween. Conductive ring-shaped member 56 includes flat unit 56f. That is, the pressing force with respect to first O-ring 52a is applied to first O-ring 52a via flat unit 56f of conductive ring-shaped member 56. Conductive ring-shaped member 56 includes flat unit 56f, so that the pressing force can evenly be applied to first O-ring 52a. Accordingly, first O-ring 52a can surely be pressed against seating surface Bsa, and the liquid in the vessel can surely be sealed. Similarly, the pressing force is properly applied to second O-ring 52b, so that the liquid outside the vessel can surely be sealed.

An example of a method for fitting conductive ring-shaped member 56 in tubular thermoelectric generator T will be described below.

As illustrated in FIG. 11A, the end portions of tubular thermoelectric generator T1 and tubular thermoelectric generator T2 are inserted in openings A61 and A62 of first plate portion 36a. Then, first O-ring 52a and washer 54 if necessary are fitted from a leading end of the tubular thermoelectric generator, and moved to backs of openings A61 and A62. Then, conductive ring-shaped member 56 is fitted from the leading end of the tubular thermoelectric generator, and moved to the backs of openings A61 and A62. Then, conductive member J1 and washer 54 and second O-ring 52b if necessary are fitted from the leading end of the tubular thermoelectric generator, and moved to the backs of openings A61 and A62. Finally, the sealing surface of second plate portion 36b is opposed to first plate portion 36a, and second plate portion 36b and first plate portion 36a are joined to each other such that the leading end of the tubular thermoelectric generator is inserted in the opening of second plate portion 36b. For example, the flange connection can be applied to the joint between second plate portion 36b and first plate portion 36a. In this case, second plate portion 36b and first plate portion 36a can be joined to each other through hole 36bh made in second plate portion 36b in FIG. 7B and a hole made in first plate portion 36a in FIG. 7B with bolts and nuts.

Conductive ring-shaped member 56 and tubular thermoelectric generator T are not permanently connected to each other, but conductive ring-shaped member 56 is detachably attached to tubular thermoelectric generator T. For example, an operation opposite of the operation to fit conductive ring-shaped member 56 in tubular thermoelectric generator T may be performed in the case where tubular thermoelectric generator T is replaced with new tubular thermoelectric generator T. Conductive ring-shaped member 56 can repeatedly be used, or conductive ring-shaped member 56 may be replaced with new conductive ring-shaped member 56.

The shape of conductive ring-shaped member 56 is not limited to the example in FIG. 12A. A ratio of a width (a size in a radial direction) of flat unit 56f and a radius of through-hole 56a can arbitrarily be decided. Each elastic unit 56r can have various shapes, and the number of elastic units 56r can arbitrarily be decided.

Figure 12B:
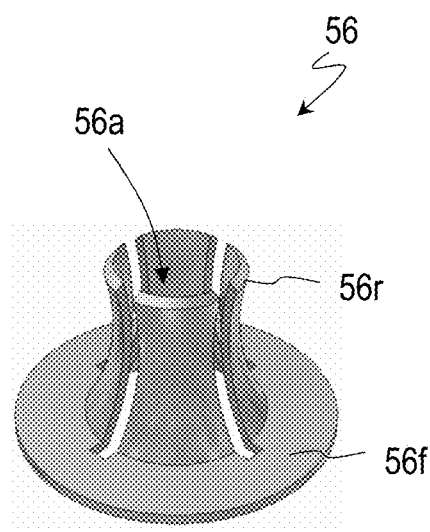
FIG. 12B is a perspective view illustrating another example of the shape of the conductive ring-shaped member.

FIG. 12B is a perspective view illustrating another example of the shape of conductive ring-shaped member 56. Conductive ring-shaped member 56 in FIG. 12B further includes ring-shaped flat unit 56f and the plurality of elastic units 56r. Flat unit 56f includes through-hole 56a. Each of the plurality of elastic units 56r is projected from a rim of through-hole 56a in flat unit 56f, and biased toward the center of through-hole 56a by an elastic force. In the example of FIG. 12B, there are four elastic units 56r. The number of elastic units 56r may be two, preferably the number of elastic units 56r is at least three. For example, the number of elastic units 56r is set to at least six.

In the configuration in which planar conductive member J is brought into contact with flat unit 56f of conductive ring-shaped member 56, there is a gap (allowance) between the through-hole in the ring portion of conductive member J and the tubular thermoelectric generator inserted in the through-hole. Therefore, even if the tubular thermoelectric generator is made of a brittle material, the stable connection can be implemented while ring portion Jr1 of conductive member J does not damage the tubular thermoelectric generator.

<Relationship Between Orientation of Heat Flow and Tilt Direction of Stacking Plane>

A relationship between the orientation of the heat flow and the tilt direction of the stacking plane in tubular thermoelectric generator T will be described with reference to FIGS. 16A and 16B.

Figure 16A:
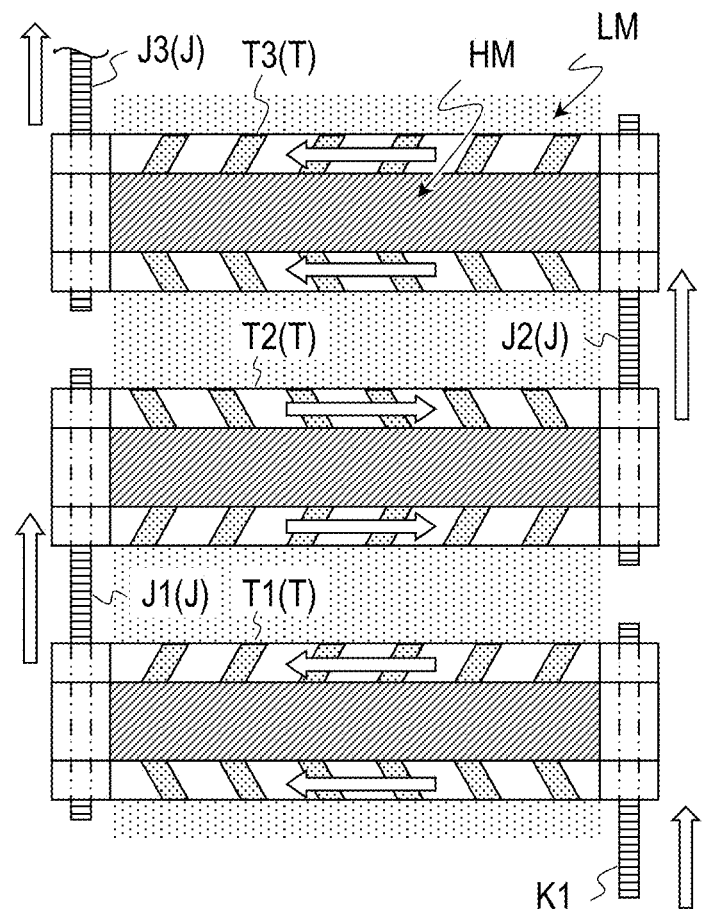
FIG. 16A is a view schematically illustrating a current passing through the tubular thermoelectric generators electrically connected in series with one another.

FIG. 16A is a view schematically illustrating the current passing through tubular thermoelectric generators T electrically connected in series with one another. FIG. 16A schematically illustrates three (T1 to T3) sections in tubular thermoelectric generators T1 to T10.

In FIG. 16A, conductive member K1 is connected to one end (for example, the end portion on the first electrode side) of tubular thermoelectric generator T1, and conductive member (coupling plate) J1 is connected to the other end (for example, the end portion on the second electrode side) of tubular thermoelectric generator T1. Conductive member J1 is also connected to one end (the end portion on the first electrode side) of tubular thermoelectric generator T2, whereby tubular thermoelectric generator T1 is electrically connected to tubular thermoelectric generator T2. Additionally, the other end (the end portion on the second electrode side) of tubular thermoelectric generator T2 is electrically connected to one end (the end portion on the first electrode side) of tubular thermoelectric generator T3 by conductive member J2.

At this point, as illustrated in FIG. 16A, the tilt direction of the stacking plane in tubular thermoelectric generator T1 is opposite to the tilt direction of the stacking plane in tubular thermoelectric generator T2. Similarly, the tilt direction of the stacking plane in tubular thermoelectric generator T2 is opposite to the tilt direction of the stacking plane in tubular thermoelectric generator T3. That is, in thermoelectric power generation unit 100, the tilt direction of the stacking plane in each of tubular thermoelectric generators T1 to T10 is opposite to the tilt direction of the stacking plane in the tubular thermoelectric generator connected to itself via coupling plate.

At this point, as illustrated in FIG. 16A, high-temperature medium HM is brought into contact with the inner circumferential surface of each of tubular thermoelectric generators T1 to T3, and low-temperature medium LM is brought into contact with the outer circumferential surface. Therefore, in the tubular thermoelectric generator T1, for example, the current flows from the right side in FIG. 16A toward the left side. On the other hand, because the tilt direction of the stacking plane in tubular thermoelectric generator T2 is opposite to the tilt direction of the stacking plane in tubular thermoelectric generator T1, the current flows from the left side in FIG. 16A toward the right side.

Figure 17:
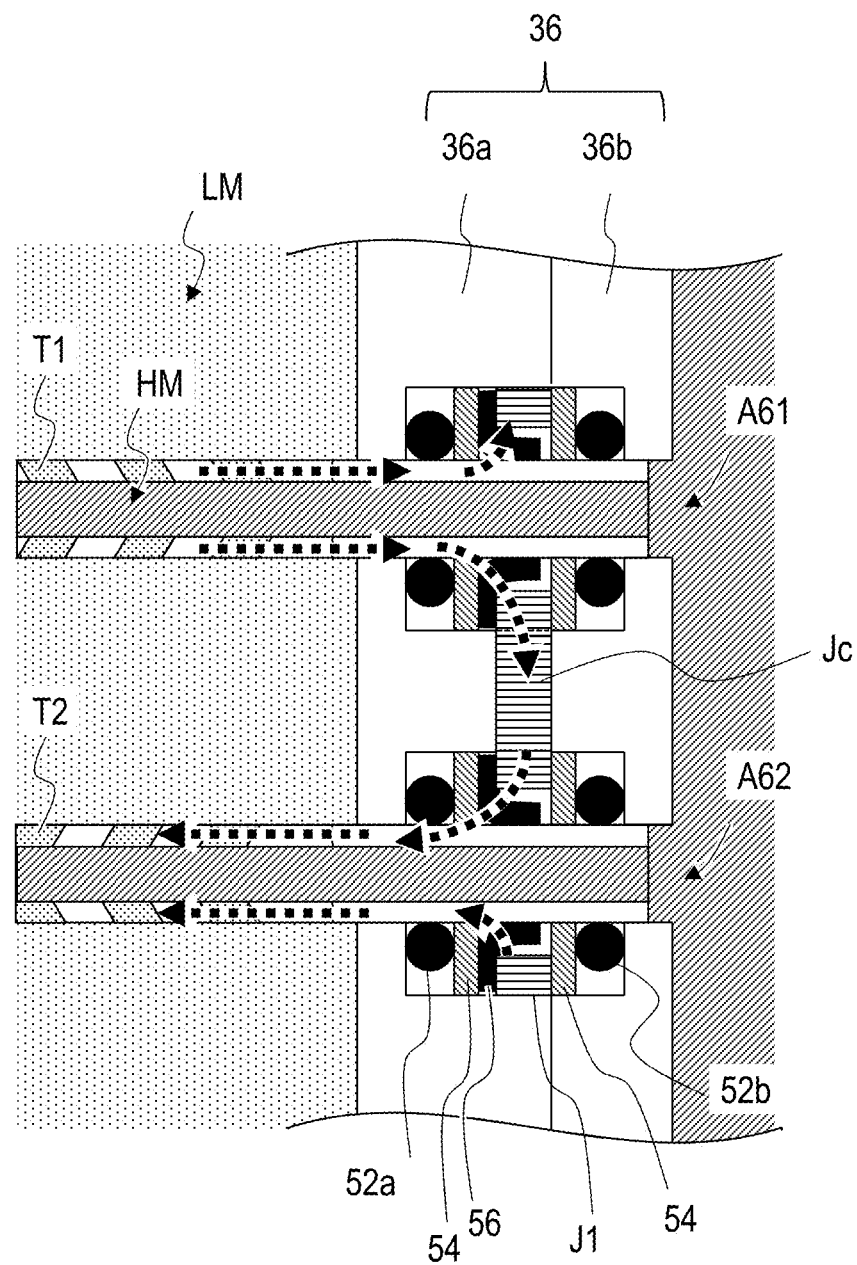
FIG. 17 is a view schematically illustrating a current orientation in the two openings and the neighborhood of the two openings.

FIG. 17 is a view schematically illustrating a current orientation in two openings A61 and A62 and the neighborhood of openings A61 and A62. FIG. 17 is a view corresponding to FIG. 10. In FIG. 17, the current passage direction is schematically illustrated by a broken-line arrow. As illustrated in FIG. 17, the current generated by tubular thermoelectric generator T1 flows toward tubular thermoelectric generator T2 via ring-shaped conductive member 56 on the side of opening A61, conductive member J1, and ring-shaped conductive member 56 on the side of opening A62. The current flowing in tubular thermoelectric generator T2 is overlapped with the current generated by tubular thermoelectric generator T2, and flows toward tubular thermoelectric generator T3. As illustrated in FIG. 16A, the tilt direction of the stacking plane in tubular thermoelectric generator T3 is opposite to the tilt direction of the stacking plane in tubular thermoelectric generator T2. Therefore, in the tubular thermoelectric generator T3, the current flows from the right side in FIG. 16A toward the left side. Accordingly, the electromotive forces generated by tubular thermoelectric generators T1 to T3 are overlapped with one another without canceling one another. The plurality of tubular thermoelectric generators T are sequentially connected such that the tilt directions of the stacking planes are opposite to each other, which allows the large voltage to be taken out from the thermoelectric power generation unit.

Figure 16B:
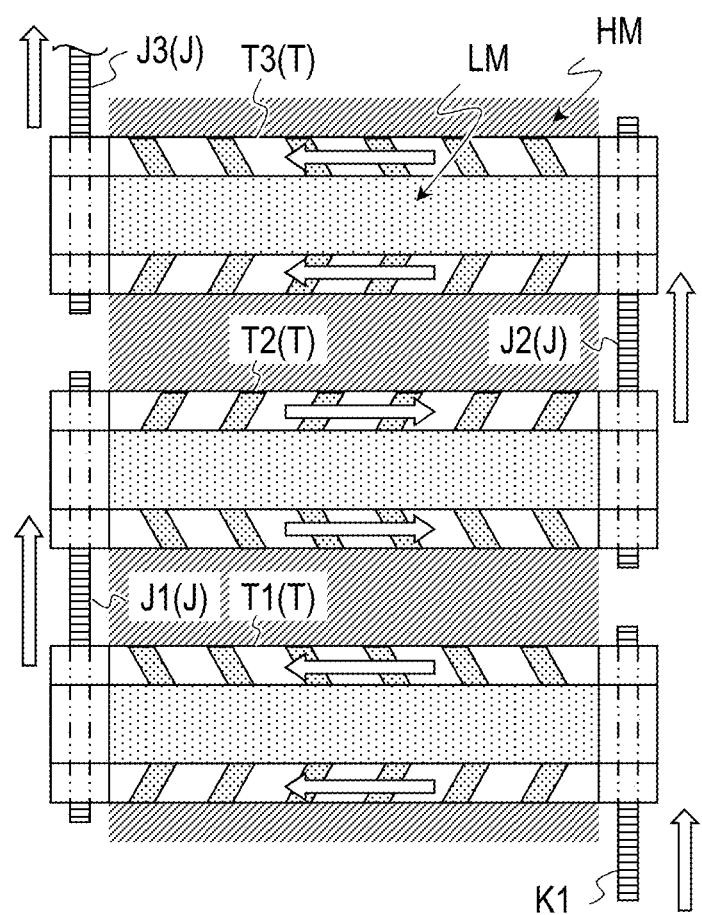
FIG. 16B is a view schematically illustrating the current passing through the tubular thermoelectric generators electrically connected in series with one another.

Referring to FIG. 16B, FIG. 16B schematically illustrates the current passing through tubular thermoelectric generators T electrically connected in series with one another. In FIG. 16B, similarly to the example in FIG. 16A, tubular thermoelectric generators T1 to T3 are sequentially connected such that the tilt directions of the stacking planes are opposite to each other. In this case, because the tilt directions of the stacking planes are opposite to each other in the two tubular thermoelectric generators connected to each other, the electromotive forces generated by tubular thermoelectric generators T1 to T3 are overlapped with one another without canceling one another.

As illustrated in FIG. 16B, when low-temperature medium LM is brought into contact with the inner circumferential surface of each of tubular thermoelectric generators T1 to T3 while high-temperature medium HM is brought into contact with the outer circumferential surface, the polarity of the voltage generated by each of tubular thermoelectric generators T1 to T3 is reversed compared with the case in FIG. 16A. In other words, when the orientation of the temperature gradient in each of the tubular thermoelectric generators is inverted, the polarity (the orientation of the current passing through the tubular thermoelectric generator) of the electromotive force in each of the tubular thermoelectric generators is inverted. Accordingly, for example, in order that the current flows from the side of conductive member K1 toward the side of conductive member J3 similarly to the case in FIG. 16A, it is necessary to reverse the first electrode side and the second electrode side in each of tubular thermoelectric generators T1 to T3 compared with the case in FIG. 16A. FIGS. 16A and 16B illustrate the current orientation only by way of example. Depending on the material constituting metallic layer 20 and the thermoelectric material constituting thermoelectric material layer 22, sometimes the current orientation is reversed compared with the current orientation in FIGS. 16A and 16B.

As described above with reference to FIGS. 16A and 16B, the polarity of the voltage generated by tubular thermoelectric generator T depends on the tilt direction of the stacking plane in tubular thermoelectric generator T. Therefore, for example, in the case where tubular thermoelectric generator T is replaced, it is necessary to properly dispose tubular thermoelectric generator T in consideration of the temperature gradient between the inner circumferential surface and outer circumferential surface of tubular thermoelectric generator T in thermoelectric power generation unit 100.

Figure 18A:
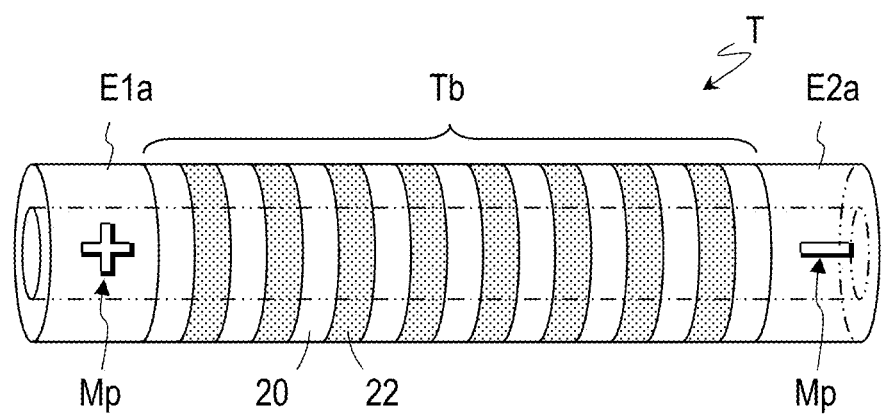
FIG. 18A is a perspective view illustrating the tubular thermoelectric generator having polarities displayed at electrodes.
Figure 18B:
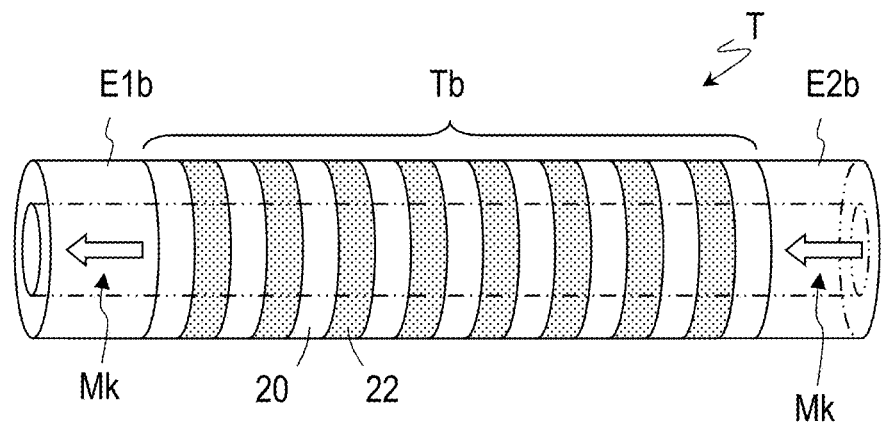
FIG. 18B is a perspective view illustrating the tubular thermoelectric generator having polarities displayed at electrodes.

FIGS. 18A and 18B are perspective views illustrating the tubular thermoelectric generator having polarities displayed at the electrodes. In tubular thermoelectric generator T of FIG. 18A, molds (irregularity shapes) Mp are formed in first electrode E1a and second electrode E2a in order to identify the polarity of the voltage generated by the tubular thermoelectric generator. In tubular thermoelectric generator T of FIG. 18B, marks Mk indicating which one of the sides of first electrode E1b and second electrode E2b the stacking plane in tubular thermoelectric generator T is tilted on are made on first electrode E1b and second electrode E2b. The mold and the mark may be combined with each other. The mold and the mark may be made on tube body Tb, or on one of the first electrode and the second electrode.

Thus, the mold and the mark can be made on, for example, the first electrode and the second electrode in order to identify the polarity of the voltage generated by tubular thermoelectric generator T. Therefore, which one of the sides of first electrode E1a and second electrode E2a the stacking plane in tubular thermoelectric generator T is tilted on can be determined from the appearance of tubular thermoelectric generator T. Alternatively, the first electrode and the second electrode may be formed into shapes different from each other instead of making the mold or the mark. For example, the first electrode and the second electrode may differ from each other in the length, the thickness, or the shape of the section perpendicular to the axial direction.

<Electric Connection Structure Taking Out Power to Outside of Thermoelectric Power Generation Unit 100>

Referring to FIG. 5, ten tubular thermoelectric generators T1 to T10 are electrically connected in series by conductive members J1 to J9. The connection between two tubular thermoelectric generators T with each of conductive members J1 to J9 is described above. An example of an electric connection structure taking out the power to the outside of thermoelectric power generation unit 100 from two tubular thermoelectric generators T1 and T10 located at both the ends of the series circuit will be described below.

Figure 19:
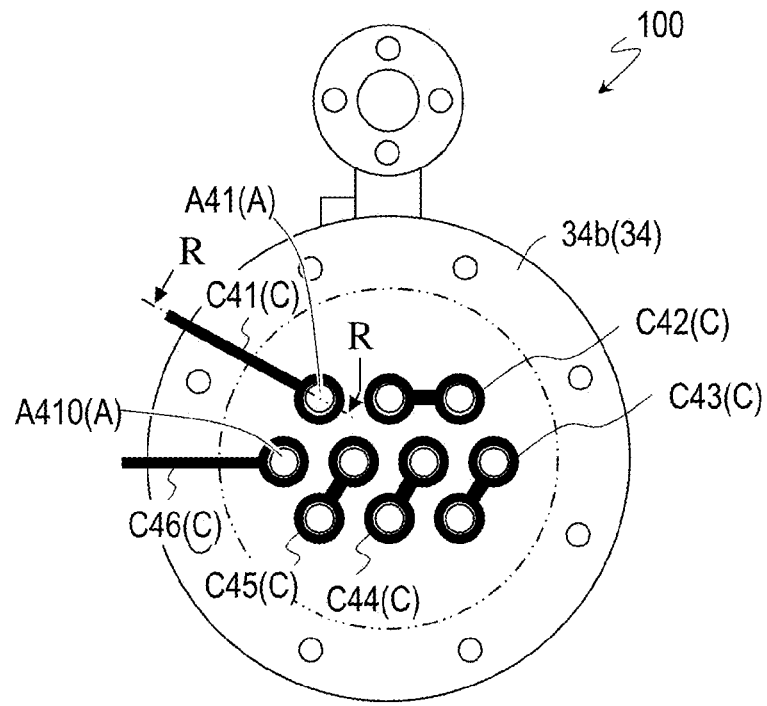
FIG. 19 is a view illustrating the other (in this case, a left side view) side surface of the thermoelectric power generation unit in FIG. 7A.

Referring to FIG. 19, FIG. 19 is a view illustrating the other side surface (in this case, left side view) of thermoelectric power generation unit 100 in FIG. 7A. FIG. 19 illustrates the configuration on the side of plate 34, while FIG. 7B illustrates the configuration on the side of plate 36. The configuration and operation similar to those of plate 36 are not repeated in the description of plate 34.

As illustrated in FIG. 19, each of channels C42 to C45 couples at least two openings A provided in plate 34. Hereinafter, sometimes the channel is referred to as a "mutual connection portion". The conductive member accommodated in each mutual connection portion has the configuration similar to that of conductive member J1. On the other hand, channel C41 is provided in plate 34 so as to extend from opening A41 to the rim in plate 34. Hereinafter, sometimes the channel that is provided in the plate so as to extend from the opening to the rim is referred to as a "terminal connection portion". Channel C41 and C46 in FIG. 19 are the terminal connection portions. The conductive member that acts as a terminal used to connect with an external circuit is accommodated in the terminal connection portion.

Figure 20:
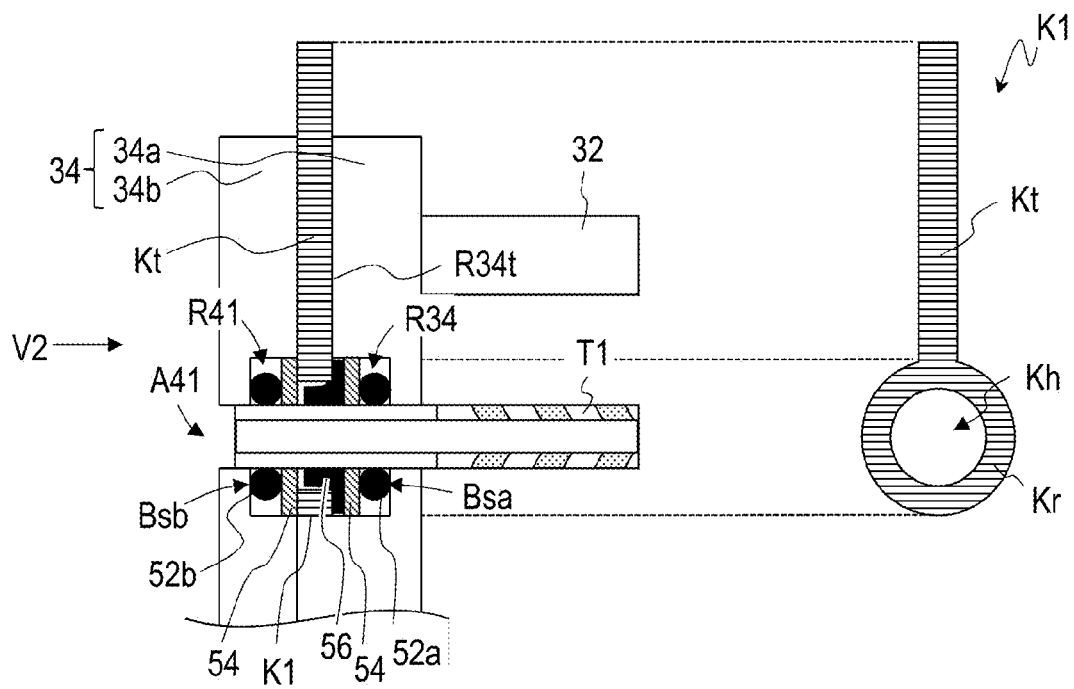
FIG. 20 is a view illustrating a partial section of a plate and an appearance of a conductive member when the conductive member is viewed from a direction indicated by an arrow.

FIG. 20 is a view illustrating a partial section of plate 34. The left side of FIG. 20 schematically illustrates the section when plate 34 is cut in the plane including the center axis of tubular thermoelectric generator T1, and corresponds to the sectional view taken on a line R-R in FIG. 19. The left side of FIG. 20 illustrates the structure of opening A41 in the plurality of openings A included in plate 34 and the neighborhood of opening A41. The right side of FIG. 20 illustrates the appearance of conductive member K1 when conductive member K1 is viewed from a direction indicated by arrow V2 in the left side of FIG. 20. Conductive member K1 includes through-hole Kh at one end. More particularly, conductive member K1 includes ring portion Kr including through-hole Kh and terminal unit Kt extending from ring portion Kr toward the outside of ring portion Kr. Typically, conductive member K1 is made of metal similarly to conductive member J1. The surfaces of ring-shaped conductive member 56 and conductive member K1 may be subjected to plating using the same kind of metal.

As illustrated in FIG. 20, the end portion (first electrode side) of tubular thermoelectric generator T1 is inserted in opening A41 of plate 34. At this point, the end portion of tubular thermoelectric generator T1 is inserted in through-hole Kh of conductive member K1. Thus, conductive member (J and K1) in one aspect of the present disclosure is said to be the conductive plate including at least one hole through which tubular thermoelectric generator T passes. The structure of opening A410 and the neighborhood of opening A410 is similar to the structure of opening A41 and the neighborhood of opening A41 except that the end portion of tubular thermoelectric generator T10 is inserted in opening A410 of plate 34.

Referring to FIG. 20, recess R34 is provided in first plate portion 34a according to openings A41. Recess R34 includes trench portion R34t reaching to the outer edge of first plate portion 34a from opening A41. Terminal unit Kt of conductive member K1 is located in trench portion R34t. In FIG. 20, the space formed by recess R34 and recess R41 provided in second plate portion 34b constitutes the channel in which conductive member K1 is accommodated. Similarly to the example in FIG. 10, in the example of FIG. 20, first O-ring 52a, washer 54, ring-shaped conductive member 56, and second O-ring 52b are accommodated in channel C41 in addition to conductive member K1, and the end portion of tubular thermoelectric generator T1 pierces these members. First O-ring 52a implements the sealing such that the fluid supplied to the inside of shell 32 does not invade in channel C41. Second O-ring 52b implements the sealing such that the fluid existing outside second plate portion 34b does not invade in channel C41.

Figure 21:
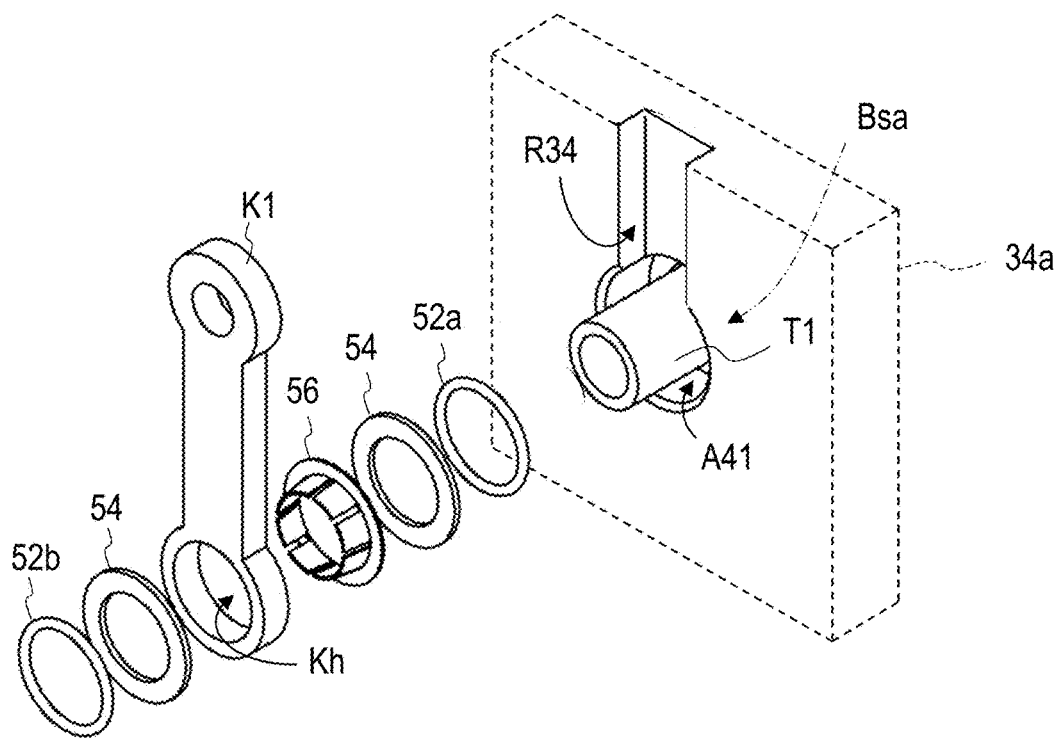
FIG. 21 is an exploded perspective view illustrating a neighborhood of a channel in which the conductive member is accommodated.

FIG. 21 is an exploded perspective view illustrating the neighborhood of channel C41 in which conductive member K1 is accommodated. For example, first O-ring 52a, washer 54, ring-shaped conductive member 56, conductive member K1, washer 54, and second O-ring 52b are inserted in openings A41 and A41 from the outside of vessel 30. The sealing surface (the surface opposed to first plate portion 34a) of second plate portion 34b has the configuration substantially similar to that of second plate portion 36b in FIG. 11B. That is, by coupling first plate portion 34a and second plate portion 34b, second seating surface Bsb of second plate portion 34b presses first O-ring 52a against seating surface Bsa of first plate portion 34a with second O-ring 52b, conductive member K1, and ring-shaped conductive member 56 being interposed therebetween. Therefore, conductive member K1 can be sealed from the high-temperature medium and the low-temperature medium.

Ring portion Kr of conductive member K1 comes into contact with flat unit 56f of ring-shaped conductive member 56 in openings A provided in plate 34. Thus, conductive member K1 is electrically connected to the outer circumferential surface in the end portion of tubular thermoelectric generator T via the ring-shaped conductive member 56. At this point, one end (terminal unit Kt) of conductive member K1 is projected to the outside of plate 34 as illustrated in FIG. 20. Accordingly, in terminal unit Kt, the portion projected to the outside of plate 34 can act as a terminal used to connect the thermoelectric power generation unit and the external circuit. As illustrated in FIG. 21, in terminal unit Kt, the portion projected to the outside of plate 34 may be formed into a ring shape. Hereinafter, sometimes conductive member, in which tubular thermoelectric generator is inserted in one end while the other end is projected to the outside, is referred to as a "terminal plate".

Thus, in thermoelectric power generation unit 100, tubular thermoelectric generators T1 and T10 are connected to the two terminal plates accommodated in terminal connection portion, respectively. In the two terminal plates, the plurality of tubular thermoelectric generators T1 to T10 are electrically connected in series via the coupling plate accommodated in the mutual connection portion of the channel. Accordingly, the power generated by the plurality of tubular thermoelectric generators T1 to T10 can be taken out to the outside via the two terminal plates in which one end is projected to the outside.

The dispositions of ring-shaped conductive member 56 and conductive member (J and K1) can properly be changed in channel C. At this point, ring-shaped conductive member 56 and the conductive member may be disposed such that elastic unit 56r of ring-shaped conductive member 56 is inserted in the through-hole (Jh1, Jh2, or Kh) of the conductive member. Flat unit 56f of ring-shaped conductive member 56 can partially be extended, and used as terminal unit Kt of conductive member K1. In this case, conductive member K1 may be eliminated.

As described above, channel C is formed by the recess provided in the first plate portion and the recess provided in the second plate portion. Alternatively, channel C may be formed by the recess provided in one of the first plate portion and the second plate portion. In the case where vessel 30 is made of metal, the insulating coating may be applied to the inside of channel C such that the electric conduction is not established between the conductive member (coupling plate and terminal plate) and vessel 30. For example, plate 34 (34a and 34b) may include the main body made of metal and the insulating coating that covers at least part of the surface of the main body. Similarly, plate 36 (36a and 36b) may include the main body made of metal and the insulating coating that covers at least part of the surface of the main body. The insulating coating applied to the surface of the conductive member can be eliminated in the case where the insulating coating is applied to the surface of the recess provided in the first plate portion and the surface of the recess provided in the second plate portion.

<Another Example of Structure for Sealing and Electric Connection>

Figure 22:
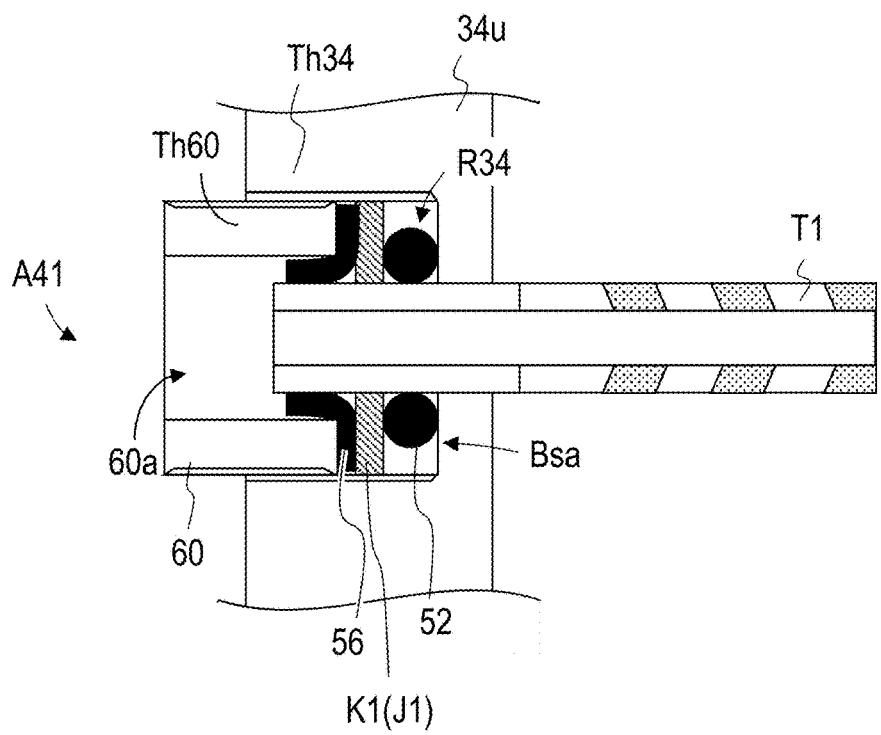
FIG. 22 is a sectional view illustrating an example of a structure in which a medium that is in contact with the outer circumferential surface of the tubular thermoelectric generator and a medium that is in contact with the inner circumferential surfaces of each of the tubular thermoelectric generators are separated from each other so as not to be mixed with each other.

FIG. 22 is a sectional view illustrating an example of a structure in which the medium in contact with the outer circumferential surface of structure tubular thermoelectric generator T and a medium in contact with the inner circumferential surfaces of each of tubular thermoelectric generators T1 to T10 are separated from each other so as not to be mixed with each other. In the example of FIG. 22, bushing 60 is inserted from the outside of vessel 30 to implement the separation between the high-temperature medium and the low-temperature medium and the electric connection between the tubular thermoelectric generator and the conductive member.

In FIG. 22, opening A41 provided in plate 34u includes female screw unit Th34. More particularly, a screw thread is formed in a wall surface of recess R34 that is provided according to opening A41 of plate 34u. Bushing 60 including male screw unit Th60 is inserted in recess R34. Bushing 60 includes through-hole 60a along the axial direction. At this point, the end portion of tubular thermoelectric generator T1 is inserted in opening A41 of plate 34u. Accordingly, through-hole 60a communicates with the internal flow passage of tubular thermoelectric generator T1 with bushing 60 being inserted in recess R34.

In order to implement the sealing and the electric connection, various members are disposed in the space formed by recess R34 and bushing 60. In the example of FIG. 22, O-ring 52, conductive member K1, and ring-shaped conductive member 56 are sequentially disposed toward the outside of vessel 30 from seating surface Bsa formed in plate 34u. The end portion of tubular thermoelectric generator T1 is inserted in the holes of these members. O-ring 52 is in contact with seating surface Bsa formed in plate 34u and the outer circumferential surface of the end portion of tubular thermoelectric generator T1. When male screw unit Th60 is inserted in female screw unit Th34, male screw unit Th60 presses O-ring 52 against seating surface Bsa with flat unit 56f of ring-shaped conductive member 56 and conductive plate K1 being interposed between male screw unit Th60 and O-ring 52. That is, the sealing can be implemented such that the fluid supplied to the inside of shell 32 is not mixed with the fluid supplied to the internal flow passage of tubular thermoelectric generator T1. The outer circumferential surface of tubular thermoelectric generator T1 comes into contact with the plurality of elastic units 56r of ring-shaped conductive member 56, and flat unit 56f of conductive ring-shaped member 56 comes into contact with ring portion Kr of conductive member K1, so that the tubular thermoelectric generator and the conductive member can be electrically connected to each other.

The use of the members in FIG. 22 can implement the separation between the high-temperature medium and the low-temperature medium and the electric connection between the tubular thermoelectric generator and the conductive member with the simpler configuration.

Figure 23A:
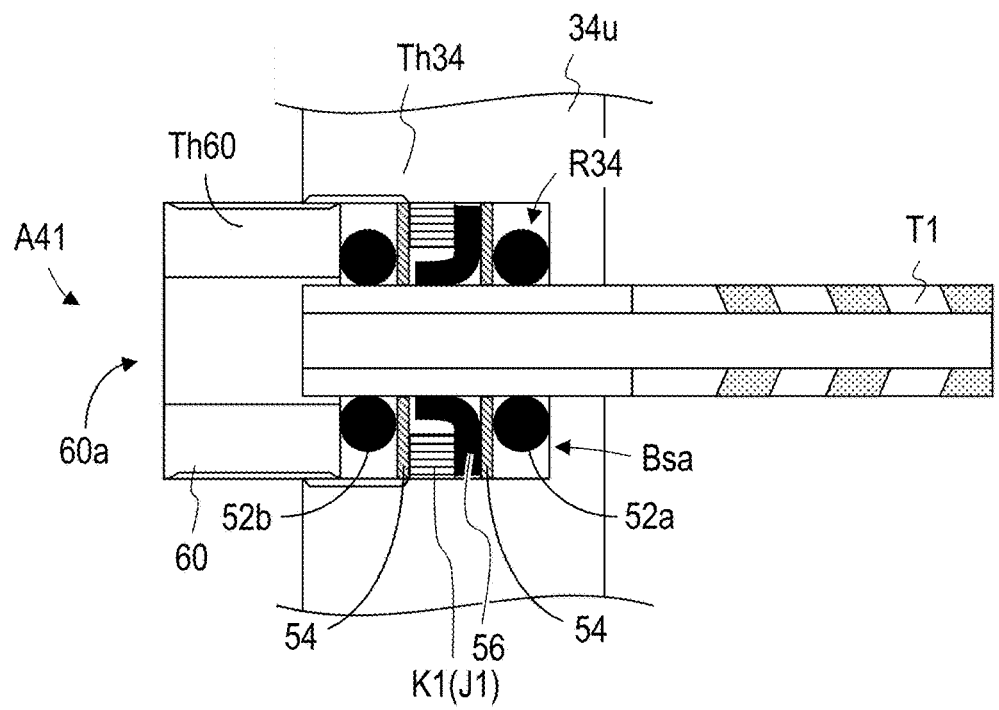
FIG. 23A is a sectional view illustrating another example of a structure implementing separation between a high-temperature medium and a low-temperature medium and electric connection between the tubular thermoelectric generator and the conductive member.
Figure 23B:
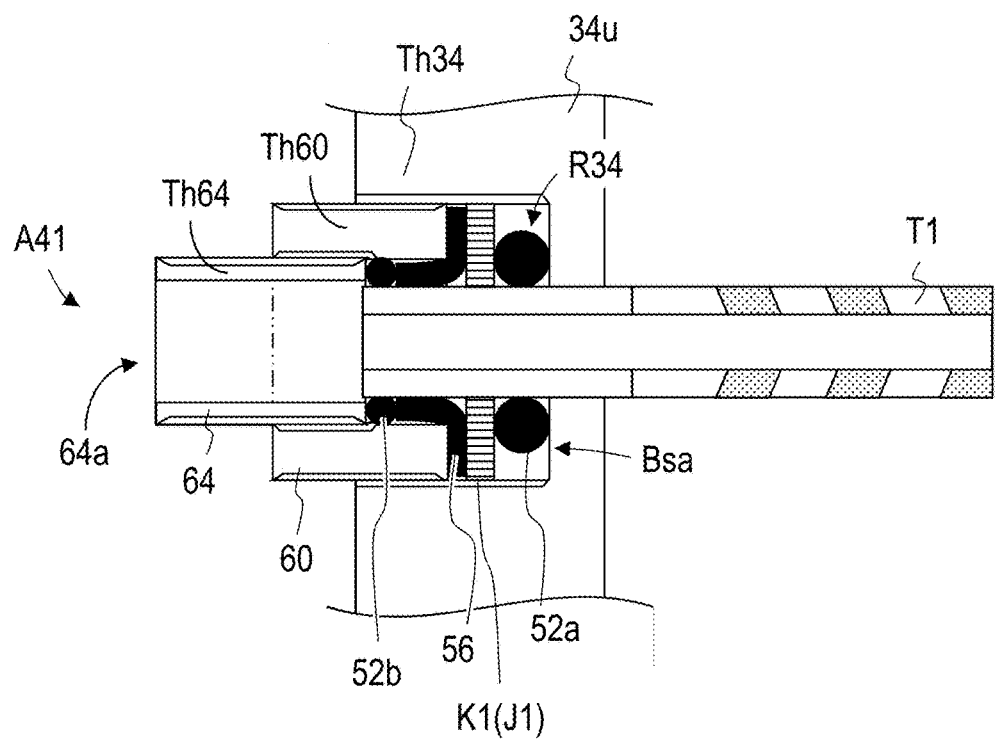
FIG. 23B is a sectional view illustrating still another example of the structure implementing the separation between the high-temperature medium and the low-temperature medium and the electric connection between the tubular thermoelectric generator and the conductive member.

FIGS. 23A and 23B are sectional views illustrating still another example of the structure implementing the separation between the high-temperature medium and the low-temperature medium and the electric connection between the tubular thermoelectric generator and the conductive member. Referring to FIG. 23A, first O-ring 52a, washer 54, ring-shaped conductive member 56, conductive member K1, washer 54, and second O-ring 52b are sequentially disposed toward the outside of vessel 30 from seating surface Bsa formed in plate 34u. In the example of FIG. 23A, male screw unit Th60 presses O-ring 52a against seating surface Bsa with conductive plate K1 and flat unit 56f of ring-shaped conductive member 56 being interposed between male screw unit Th60 and O-ring 52. Referring to FIG. 23B, first O-ring 52a, conductive member K1, ring-shaped conductive member 56, and second O-ring 52b are sequentially disposed toward the outside of vessel 30 from seating surface Bsa formed in plate 34u. Bushing 64 including through-hole 64a is further inserted in through-hole 60a formed in bushing 60. Through-hole 64a communicates with the internal flow passage of tubular thermoelectric generator T1. Male screw unit Th64 of bushing 64 presses second O-ring 52b toward seating surface Bsa. Thus, the sealing may be performed for both the fluid constituting the high-temperature medium and the fluid constituting the low-temperature medium by disposing first O-ring 52a and second O-ring 52b. The sealing is performed for both the fluid constituting the high-temperature medium and the fluid constituting the low-temperature medium to constrain the corrosion of ring-shaped conductive member 56.

As described above, one end of terminal unit Kt of conductive member K1 is projected toward the outside of plate 34u to act as the terminal used to connect the thermoelectric power generation unit and the external circuit. In aspects of FIGS. 22, 23A, and 23B, the coupling plate such as conductive member J1 may be applied instead of conductive member K1 (terminal plate). In this case, the end portion of tubular thermoelectric generator T1 is inserted in through-hole Jh1. As needed basis, washer 54 may be disposed between the O-ring and the conductive member.

<Exemplary Embodiment of Thermoelectric Power Generation System Included in Thermoelectric Power Generation Unit>

An exemplary embodiment of the thermoelectric power generation system including the thermoelectric power generation unit of the present disclosure will be described below.

Thermoelectric power generation unit 100 may singularly be used, or the plurality of thermoelectric power generation units 100 may be used with being combined. The plurality of thermoelectric power generation unit 100 can be connected in series or in parallel.

Figure 24A:
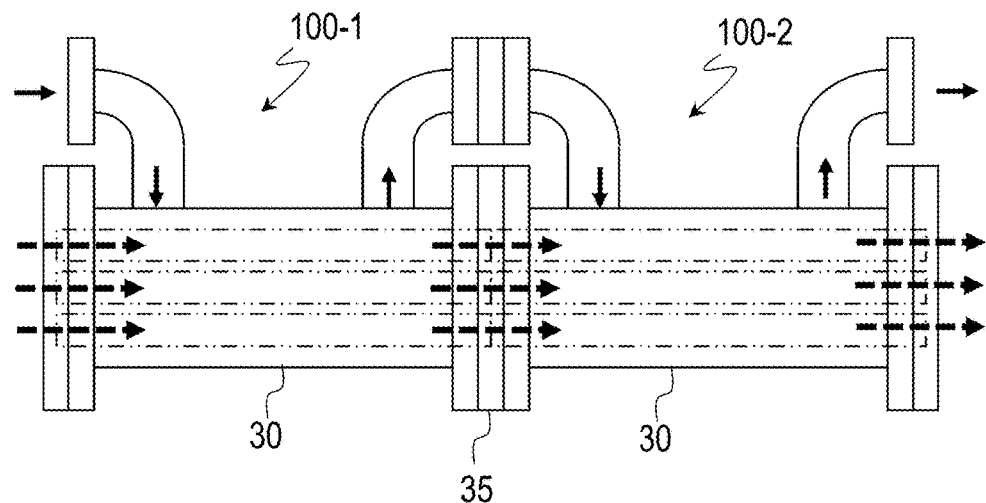
FIG. 24A is a view schematically illustrating a configuration example of a thermoelectric power generation system including a plurality of thermoelectric power generation units.
Figure 24B:
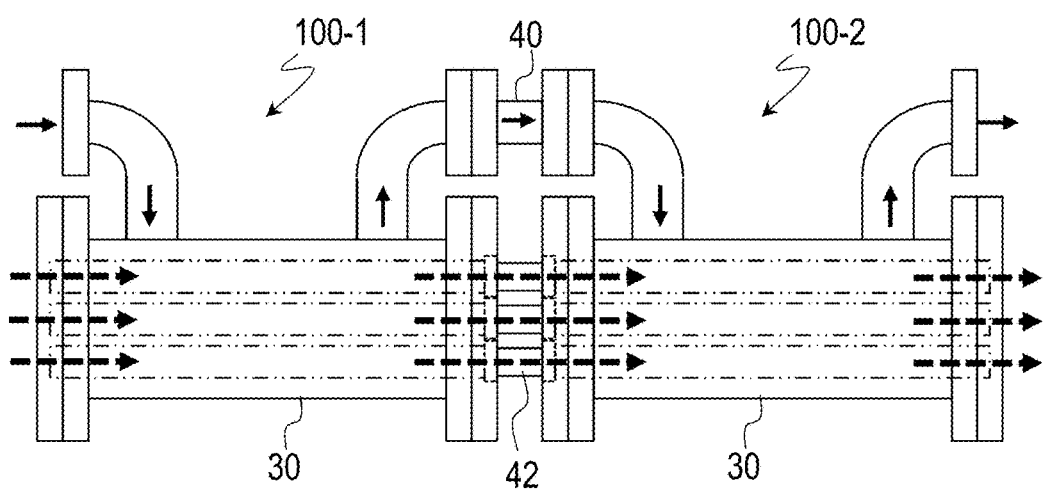
FIG. 24B is a view schematically illustrating another configuration example of the thermoelectric power generation system including the plurality of thermoelectric power generation units.
Figure 24C:
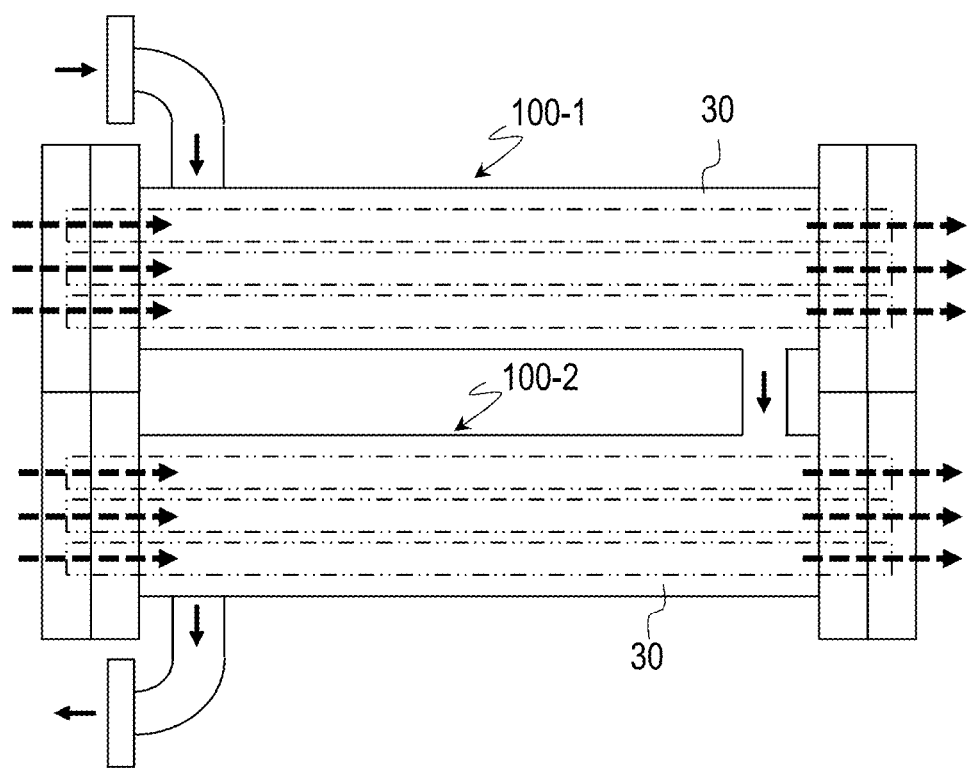
FIG. 24C is a view schematically illustrating still another configuration example of the thermoelectric power generation system including the plurality of thermoelectric power generation units.

A configuration example of the thermoelectric power generation system including the plurality of thermoelectric power generation unit will be described below with reference to FIGS. 24A, 24B, and 24C. In FIGS. 24A, 24B, and 24C, a thick solid-line arrow schematically indicates the flow direction of the medium in contact with the outer circumferential surface of the tubular thermoelectric generator, namely, the medium flowing in vessel 30 (the outside of the tubular thermoelectric generator). A thick broken-line arrow indicates the flow direction of the medium in contact with the inner circumferential surface of the tubular thermoelectric generator, namely, the medium flowing in the through-hole (internal flow passage). Hereinafter, sometimes a conduit communicating with the fluid inlet and fluid outlet of each vessel 30 is referred to as a "first medium passage" and a conduit communicating with the flow passage of each of the tubular thermoelectric generators is referred to as a "second medium passage".

Referring to FIG. 24A, the thermoelectric power generation system shown in FIG. 24 includes first thermoelectric power generation unit 100-1 and second thermoelectric power generation unit 100-2. Each of first thermoelectric power generation unit 100-1 and second thermoelectric power generation unit 100-2 has the same configuration as thermoelectric power generation unit 100. In the example of FIG. 24A, the flow passages of the plurality of tubular thermoelectric generators included in first thermoelectric power generation unit 100-1 are communicated with the flow passages of the plurality of tubular thermoelectric generators included in second thermoelectric power generation unit 100-2 via relay plate 35.

Referring to FIG. 24B, similarly to the example in FIG. 24A, the thermoelectric power generation system includes first thermoelectric power generation unit 100-1 and second thermoelectric power generation unit 100-2. However, in the example of FIG. 24B, the flow passages of the plurality of tubular thermoelectric generators included in first thermoelectric power generation unit 100-1 are communicated with the flow passages of the plurality of tubular thermoelectric generators included in second thermoelectric power generation unit 100-2 via relay conduit 42. The medium supplied to the inside of vessel 30 of first thermoelectric power generation unit 100-1 is supplied to the inside of vessel 30 of second thermoelectric power generation unit 100-2 via conduit 40. Conduits 40 and 42 are not necessarily formed into linear shape, but may be bent.

Referring to FIG. 24C, the thermoelectric power generation system in FIG. 24C includes first and second thermoelectric power generation units 100-1 and 100-2 that are disposed in parallel. In the example of FIG. 24C, the medium flowing in the tubular thermoelectric generator of first thermoelectric power generation unit 100-1 and the medium flowing in the tubular thermoelectric generator of second thermoelectric power generation unit 100-2 flow in parallel. However, the medium supplied to the inside of vessel 30 of first thermoelectric power generation unit 100-1 is supplied to the inside of vessel 30 of second thermoelectric power generation unit 2-100.

Thus, in the thermoelectric power generation system including the plurality of thermoelectric power generation unit, the flow passages of the high-temperature medium and low-temperature medium can variedly be designed. FIGS. 24A, 24B, and 24C illustrate only some examples, and the first medium passage communicating with the fluid inlet and fluid outlet of each vessel and the second medium passage communicating with the flow passage of each of the tubular thermoelectric generators can arbitrarily be designed.

<Configuration Example of Electric Circuit Included in Thermoelectric Power Generation System>

A configuration example of an electric circuit included in the thermoelectric power generation system of the present disclosure will be described with reference to FIG. 25.

Figure 25:
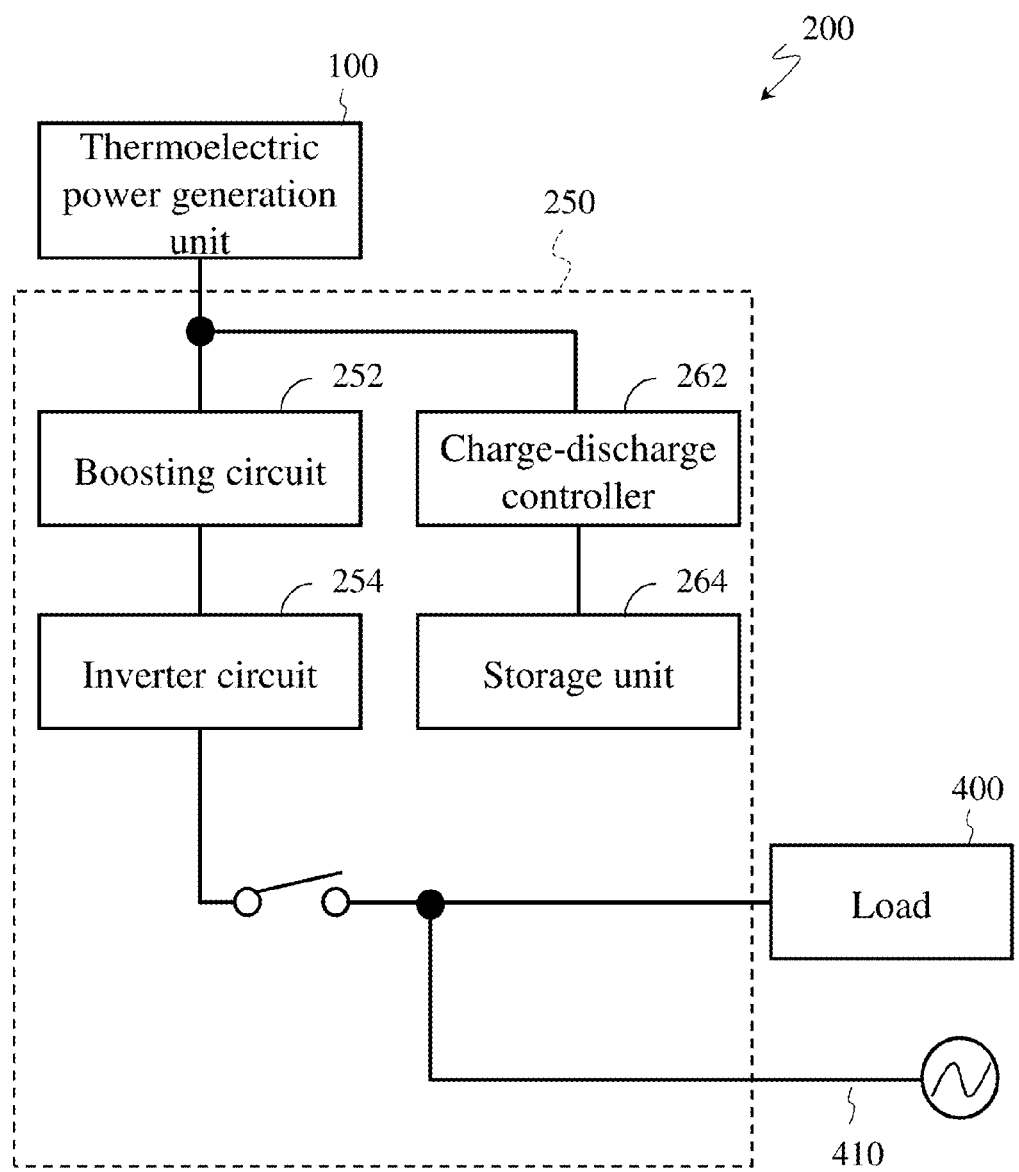
FIG. 25 is a block diagram illustrating a configuration example of an electric circuit included in the thermoelectric power generation system of the present disclosure.

Referring to FIG. 25, thermoelectric power generation system 200 in one aspect of the present disclosure includes electric circuit 250 that receives the power output from thermoelectric power generation unit 100. Electric circuit 250 includes boosting circuit 252 that boosts the voltage of the power output from thermoelectric power generation unit 100 and inverter (DC-AC inverter) circuit 254 that converts CD power output from boosting circuit 252 into AC power (for example, frequency of 50/60 Hz and so forth). The AC power output from inverter circuit 254 can be supplied to load 400. Load 400 is various electric instruments or electronic instruments that are operated using the AC power. Load 400 may have a charging function, or load 400 is not necessarily fixed to electric circuit 250. The Ac power that is not consumed by load 400 can be sold with being connected to commercial system 410.

Electric circuit 250 in FIG. 25 includes charge-discharge controller 262 and storage unit 264 in order to store the AC power obtained from thermoelectric power generation unit 100. For example, storage unit 264 is chemical batteries such as a lithium-ion secondary battery and capacitors such as an electric double-layer capacitor. As needed basis, the power stored in storage unit 264 is provided to boosting circuit 252 by charge-discharge controller 262, and the power is used or sold as the AC power via inverter circuit 254.

Sometimes the power obtained from the thermoelectric power generation unit 100 varies on a regular or irregular base according to time. For example, in the case where the heat source of the high-temperature medium is waste heat of a factory, possibly the temperature of the high-temperature medium varies depending on a running schedule of the factory. In such cases, because the power generation state of thermoelectric power generation unit 100 varies, the voltage and/or current of the power obtained from thermoelectric power generation unit 100 varies. Even if the power generation state varies, an influence of the variation of the power generation can be constrained in thermoelectric power generation system 200 of FIG. 25 when the power is stored in storage unit 264 via charge-discharge controller 262.

In the case where the power is consumed in real time at the same time as the power generation, a boosting ratio of boosting circuit 252 may be adjusted according to the variation of the power generation state. The variation of the power generation state is detected or predicted to adjust the flow rate and temperature of the high-temperature or low-temperature medium supplied to thermoelectric power generation unit 100, whereby the control may be performed such that the power generation state is maintained at a steady state.

Referring to FIG. 4, in the system shown in FIG. 4, the flow rate of the high-temperature medium can be adjusted by pump P1. Similarly, the flow rate of the low-temperature medium can be adjusted by pump P2. The power generation of the tubular thermoelectric generator can be controlled by adjusting one of or both the flow rates of the high-temperature medium and low-temperature medium.

The temperature of the high-temperature medium can also be controlled by adjusting a heat quantity supplied from the high-temperature heat source (not illustrated) to the high-temperature medium. Similarly, the temperature of the low-temperature medium can also be controlled by adjusting a heat quantity supplied from the low-temperature heat source (not illustrated) to the low-temperature medium.

Although not illustrated in FIG. 4, a valve and a branch passage are provided in at least one of the flow passages of the high-temperature medium and low-temperature medium, whereby the flow rate of each medium supplied to the power generation system may be adjusted.

<Another Aspect of Thermoelectric Power Generation System>

Another aspect of the thermoelectric power generation system of the present disclosure will be described below with reference to FIG. 26.

In one aspect of the present disclosure, thermoelectric power generation unit 100 of the present disclosure is provided in a general waste processing facility (what is called an abandoning site). Nowadays, in the waste processing facility, sometimes high-temperature high-pressure water vapor (for example, 400° C. to 500° C., several megapascal) is generated from thermoelectric energy generated in burning refuse (waste). The water vapor energy is converted into the power by turbine power generation, and used for the power in the facility.

Thermoelectric power generation system 300 in one aspect of the present disclosure includes at least one thermoelectric power generation unit 100. In an example of FIG. 26, the high-temperature medium supplied to thermoelectric power generation unit 100 is generated from combustion heat of the refuse in the waste processing facility. More particularly, the system in FIG. 26 includes incinerator 310, boiler 320 that generates the high-temperature high-pressure water vapor from the combustion heat generated in incinerator 310, and turbine 330 that is rotated by the high-temperature high-pressure water vapor generated by boiler 320. Rotating energy of turbine 330 is provided to a synchronous generator (not illustrated), and converted into the AC power (for example, three-phase AC power) by the synchronous generator.

The water vapor used in work to rotate turbine 330 is returned to liquid water by condenser 360, and supplied to boiler 320 by pump 370. The water is a working medium that circulates a "heat cycle" constructed with boiler 320, turbine 330, and condenser 360. The heat provided to the water by boiler 320 is partially provided to the cooling water by condenser 360 after performing the work to rotate turbine 330. Generally, the cooling water circulates between condenser 360 and cooling tower 350.

The heat generated by incinerator 310 is partially converted into the power energy by turbine 330, and frequently the thermal energy possessed by the low-temperature low-pressure water vapor after the work to rotate turbine 330 is not converted into the electric energy but abandoned in the surrounding environment without converting. In one aspect of the present disclosure, low-temperature water vapor or hot water after the work to rotate turbine 330 can effectively be used as the heat source of the high-temperature medium. In one aspect of the present disclosure, the heat is obtained from the low-temperature (for example, about 140° C.) water vapor by heat exchanger 340, and the hot water having the temperature of, for example, 99° C. is obtained. The hot water is supplied to thermoelectric power generation unit 100 as the high-temperature medium.

On the other hand, for example, the cooling water used in the waste processing facility can partially be used as the low-temperature medium. In the case where the waste processing facility includes cooling tower 350, the water having the temperature of, for example, 10° C. can be obtained from cooling tower 350, and used as the low-temperature medium. It is not necessary to use the special cooling tower in order to obtain the low-temperature medium, but well water and river water in or near the facility can also be used.

Figure 26:
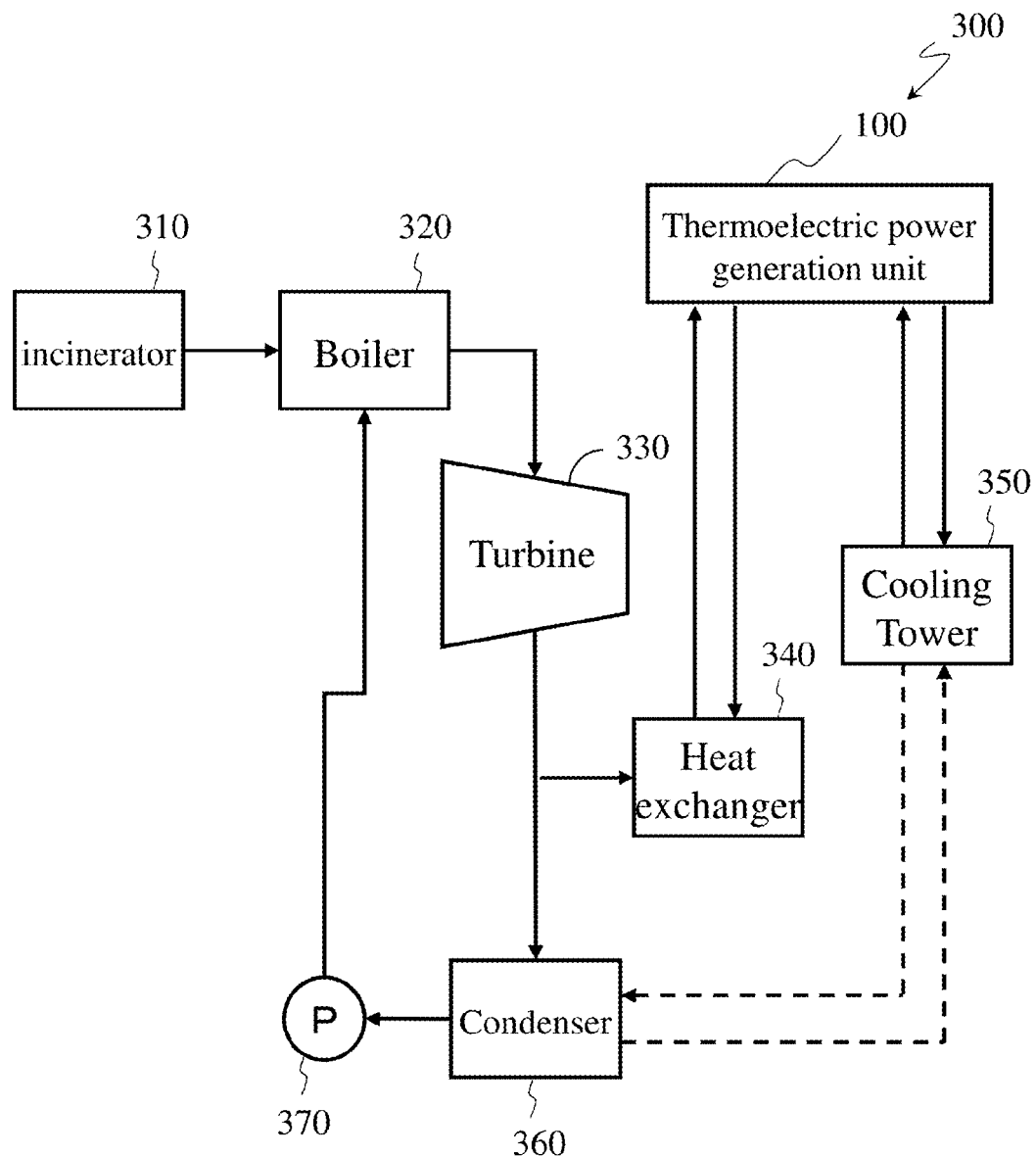
FIG. 26 is a block diagram illustrating a configuration example in which the thermoelectric power generation system of the present disclosure is used.

For example, thermoelectric power generation unit 100 in FIG. 26 can be connected to electric circuit 250 in FIG. 25. The power generated by thermoelectric power generation unit 100 can be used in the facility, or stored in storage unit 264. Surplus power can be sold via commercial system 410 after converted into the AC power.

Thermoelectric power generation system 300 in FIG. 26 has a mode in which the thermoelectric power generation unit of the present disclosure is incorporated in a waste heat recovery system of the waste processing facility including boiler 320 and turbine 330. However, in the operation of thermoelectric power generation unit 100 of the present disclosure, boiler 320, turbine 330, condenser 360, and heat exchanger 340 are not the essential constituents. The conventionally-abandoned gas or hot water having relatively low temperature can effectively be used as the high-temperature medium, or the conventionally-abandoned gas or hot water having relatively low temperature heats other gas or liquid via the heat exchanger and the heated gas or liquid can be used as the high-temperature medium. The system in FIG. 26 is one practical example.

As is clear from the above description, in one aspect of the thermoelectric power generation unit of the present disclosure, the electric connection among the plurality of tubular thermoelectric generators can be performed stably using the plurality of ring-shaped conductive members in which one end of the tubular thermoelectric generator is inserted so as to come into contact with the outer circumferential surface of the tubular thermoelectric generator. Because the tubular thermoelectric generator is used in the environment in contact with the high-temperature medium and the low-temperature medium, there is a risk of electric leakage or corrosion when the electric connection portion is in contact with the high-temperature medium and the low-temperature medium. In the present disclosure, because the electric connection can be implemented in the space where the sealing is relatively easily implemented for the high-temperature medium and the low-temperature medium, both the electric connection and sealing of the plurality of tubular thermoelectric generators can easily be implemented.

Because the electric connection is easily performed in the thermoelectric power generation module in which the ring-shaped conductive member is combined with respect to the tubular thermoelectric generator, the thermoelectric power generation module has an advantage that the thermoelectric power generation module is easily connected to another thermoelectric power generation module or the external electric circuit.

A method for producing the thermoelectric power generation unit of one aspect of the present disclosure includes a step of preparing the plurality of tubular thermoelectric generator, a step of inserting the plurality of tubular thermoelectric generators in the plurality of openings of the vessel having the above configuration to hold the plurality of tubular thermoelectric generator in the vessel, and a step of electrically connecting the plurality of tubular thermoelectric generators using the plurality of conductive members.

A power generation method of one aspect of the present disclosure includes a step of causing the first medium to flow in the vessel via the fluid inlet and fluid outlet of the vessel of the thermoelectric power generation unit to bring the first medium into contact with the outer circumferential surface of each of the tubular thermoelectric generators, a step of causing the second medium having the temperature different from that of the first medium to flow in the flow passage of each tubular thermoelectric generator, and a step of taking out the power generated by the plurality of tubular thermoelectric generators via the plurality of conductive members.

<Configuration of Thermoelectric Power Generation Unit Provided with Tilted Function>

The tube-type thermoelectric generator exhibits the thermoelectric power generation characteristics depending on the flow rate and temperature condition of the fluid. Therefore, the flow rate or temperature of the contact fluid varies in each of the tubular thermoelectric generators, and possibly spatial variations of power generation characteristics such as a voltage (hereinafter, sometimes referred to as a "terminal voltage") generated at both the ends of the tubular thermoelectric generator and an impedance matching condition are generated in the thermoelectric power generation system. As used herein, the impedance matching condition means a condition that is imposed to the current passing through the tubular thermoelectric generator in order to maximize the power generation of the tubular thermoelectric generator. The variation of the terminal voltage or impedance matching condition between the tubular thermoelectric generators possibly causes a power generation loss when at least the two tubular thermoelectric generators are electrically connected in series or in parallel.

For example, it is considered that two tubular thermoelectric generators having electromotive forces e1 and e2 and internal resistances R1 and R2 are electrically connected in series to obtain the larger power. In the tubular thermoelectric generators, the power generation is maximized when the currents I1=e1/2R1 and I2=e2/2R2 are passed. This current condition is referred to as the impedance matching condition. Therefore, in the case where the two tubular thermoelectric generators are connected in series, the current conditions in which the power generation is maximized cannot simultaneously be satisfied when the two tubular thermoelectric generators differ from each other in the impedance matching condition. In the case where the two tubular thermoelectric generators are connected in parallel, when the two tubular thermoelectric generators differ from each other in the terminal voltage, power consumption caused by the current looping in the parallel circuit is generated, which results in the power generation loss.

A specific example in which the power generation of the tubular thermoelectric generator varies will be described below. For example, in the case where the flow passages of the thermoelectric power generation units are connected in series, with the progress of the heat exchange between the hot water and cool water passing through the thermoelectric power generation unit, the temperatures of the hot water and cool water change while proceeding from an upstream side toward a downstream side. In a parallel flow method in which the hot water and the cool water flow in the same direction inside and outside the tubular thermoelectric generator, the temperature difference is lost while the hot water and cool water proceed from the upstream side toward the downstream side, and the terminal voltage and power generation are decreased on the downstream side. In a counter-flow method in which the hot water and the cool water flow in the opposite directions, the temperature difference changes due to a difference in specific heat between the hot water and the cool water while the hot water and cool water proceed from the upstream side toward the downstream side, and the terminal voltage and the impedance matching condition also change. The spatial variation of the power generation characteristic possibly becomes an obstacle to the efficient power generation.

Desirably a method for changing the shapes and number of tubular thermoelectric generators in the thermoelectric power generation unit is adopted as means for solving the variation problem of the power generation characteristic. The power generation characteristic of the tubular thermoelectric generator can be controlled by an inner diameter and/or a wall thickness as described below. Assuming that r is an inner diameter of the tubular thermoelectric generator, d is wall thickness (=outer diameter−inner diameter), and L is a total length, terminal voltage Voc with respect to temperature difference ΔT generated in and out of the thermoelectric generator, internal resistance R, current Iopt satisfying the impedance matching condition, and terminal voltage Vopt under the impedance matching condition including the voltage drop in the tubular thermoelectric generator are expressed as follows.

$$Voc = S\Delta T \times \{L/d\}$$

$$R = \rho L / \{\pi d (2r+d)\}$$

$$Iopt = Voc/2R = \{S/2\rho\} \times \{\pi(2r+d)\Delta T\}$$

$$Vopt = Voc - R \times Iopt = \{S/2\rho\} \times \Delta T \times \{L/d\}$$

In this case, S is a Seebeck coefficient of the tubular thermoelectric generator and ρ is electric resistivity of the tubular thermoelectric generator. That is, in the case where the tubular thermoelectric generators are electrically connected in series, S, ρ, r, and d are designed based on the above relational expressions according to ΔT such that currents Iopt of the tubular thermoelectric generators are matched, which allows the power generation loss to be minimized. In the case where the tubular thermoelectric generators are electrically connected in parallel, S, L, and d are designed such that terminal voltages Vopt under the impedance matching conditions are matched, which allows the power generation loss to be minimized. However, terminal voltage Vopt is a half of terminal voltage Voc, matching terminal voltages Vopt of the two tubular thermoelectric generators is equivalent to matching terminal voltages Voc of the two tubular thermoelectric generators.

The four relational expressions hold even if one interval in the axial direction of the one tubular thermoelectric generator is cut out. Therefore, in the case where ΔT changes in one tubular thermoelectric generator, S, ρ, r, and d are changed along the axial direction to equalize current rate Iopt in each interval, and the power generation of the tubular thermoelectric generator can be maximized.

Figure 27:
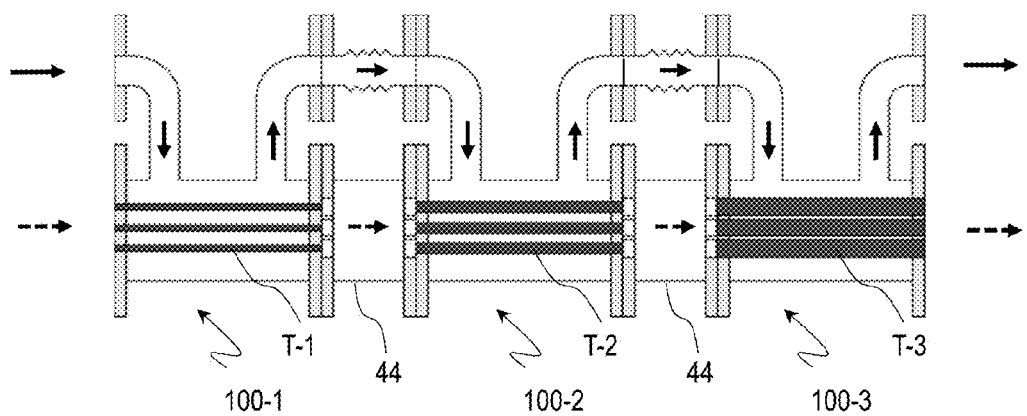
FIG. 27 illustrates a configuration example of the thermoelectric power generation system in which a number of tubular thermoelectric generators is changed in a flow passage direction.

As to a countermeasure of the decrease in terminal voltage Voc in conjunction with the decrease in temperature difference ΔT from the upstream side toward the downstream side, as illustrated in FIG. 27, the flow rate is effectively increased in the downstream thermoelectric power generation unit to reduce a wall thickness of the tube. In the case where current Iopt decreases in conjunction with the decrease in temperature difference ΔT from the upstream side toward the downstream side, as illustrated in FIG. 27, the impedance matching conditions can be matched by increasing the inner diameter or the wall thickness.

In the configuration in FIG. 27, thermoelectric power generation unit 100-1 including tubular thermoelectric generator T-1, thermoelectric power generation unit 100-2 including tubular thermoelectric generator T-2, and thermoelectric power generation unit 100-3 including tubular thermoelectric generator T-3 are connected in series from the upstream side toward the downstream side. For example, the inner diameter of tubular thermoelectric generator T-2 may be increased larger than the inner diameter of tubular thermoelectric generator T-1, and the inner diameter of tubular thermoelectric generator T-3 may be increased larger than the inner diameter of tubular thermoelectric generator T-2. For example, the wall thickness of tubular thermoelectric generator T-2 may be increased larger than the wall thickness of tubular thermoelectric generator T-1, and the wall thickness of tubular thermoelectric generator T-3 may be increased larger than the wall thickness of tubular thermoelectric generator T-2.

In the example in FIG. 27, coupling pipe (hereinafter, also referred to as a "buffer tank") 44 that relays the two thermoelectric power generation units adjacent to each other is provided between the thermoelectric power generation units. As illustrated in FIG. 27, buffer tank 44 includes a first opening that communicates with the flow passage of the tubular thermoelectric generator in the first thermoelectric power generation unit (for example, thermoelectric power generation unit 100-1) and a second opening that communicates with the flow passage of the tubular thermoelectric generator in the second thermoelectric power generation unit (for example, thermoelectric power generation unit 100-2). That is, the fluid flowing in the internal flow passage of tubular thermoelectric generator T-1 flows into buffer tank 44 disposed between thermoelectric power generation unit 100-1 and thermoelectric power generation unit 100-2. Then the fluid flowing in the buffer tank 44 flows into the internal flow passage of tubular thermoelectric generator T-2.

Figure 28:
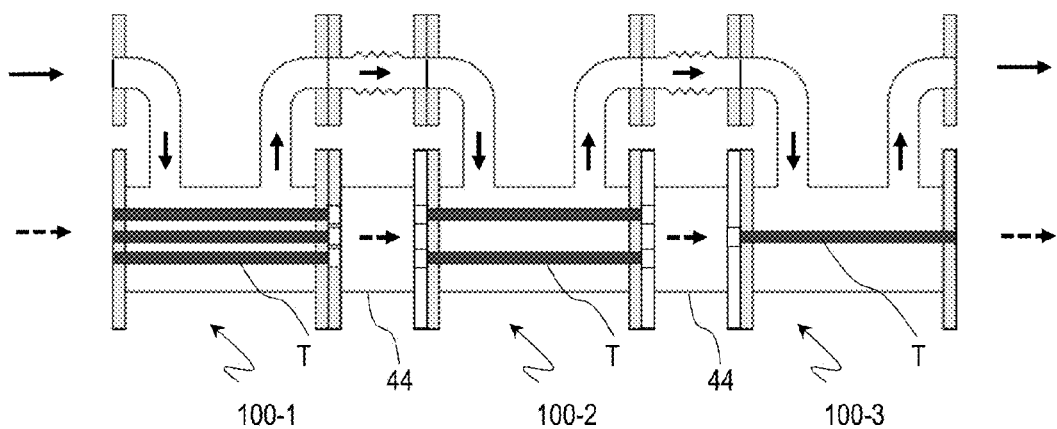
FIG. 28 illustrates another configuration example of the thermoelectric power generation system in which the number of tubular thermoelectric generators is changed in the flow passage direction.

As illustrated in FIG. 28, the terminal voltages and the impedance matching conditions are effectively matched by decreasing the number of tubular thermoelectric generators T in the downstream thermoelectric power generation unit. When the number of tubular thermoelectric generators T is decreased in the thermoelectric power generation unit, because the flow rate of the hot warter/cool water increases per one tubular thermoelectric generator, temperature difference ΔT in tubular thermoelectric generator T can come closer to temperature difference (Tw–Tc) between the fluids to cover the decreases in terminal voltage Voc and current rate Iopt caused by the decrease in temperature difference. In this case, Tw is a temperature of the high-temperature medium (for example, hot water) and Tc is a temperature of the low-temperature medium (for example, cool water). Similarly, like thermoelectric power generation unit 100A in FIG. 29, the tube diameter and the wall thickness are effectively decreased in the flow passage direction (in this case, axial direction) in tubular thermoelectric generator TA.

On the other hand, in the section perpendicular to the flow passage direction, the contact of the high-temperature medium/low-temperature medium with the tubular thermoelectric generator varies depending on the position of the tubular thermoelectric generator. For example, as illustrated in FIG. 27, in the case where the buffer tank is provided between the two thermoelectric power generation units adjacent to each other, possibly the flow rate at which the fluid flows from the buffer tank varies depending on the position of the tubular thermoelectric generator. Therefore, even in one thermoelectric power generation unit, possibly the tubular thermoelectric generator exerts the power generation characteristic that is spatially uneven.

Generally, in the buffer tank provided on the upstream side of the thermoelectric power generation unit, the flow rate decreases from the center toward the outside because the fluid is affected by viscous resistance near the wall surface. Assuming that a is a radius (in this case, radius a is equal to the radius of buffer tank) of the thermoelectric power generation unit in the section perpendicular to the flow passage direction, it is well known from a thermal fluid theory that flow rate v at a point distant from the center of the thermoelectric power generation unit by distance x is proportional to $a^2-x^2$. According to the discussion of the inventor, temperature difference ΔT in the tubular thermoelectric generator is proportional to flow rate v when the fluid flows in the internal flow passage of the tubular thermoelectric generator at low speed, and temperature difference ΔT in the tubular thermoelectric generator is saturated to temperature difference (Th–Tc) when the fluid flows at high speed. Therefore, possibly temperature difference ΔT in each of the tubular thermoelectric generators decreases from the center of the thermoelectric power generation unit toward the outside. In the case where the flow rate changes in the section, the variation of the thermoelectric power generation characteristic of each of the tubular thermoelectric generators can be decreased by changing the tube diameter in the section.

Figure 30:
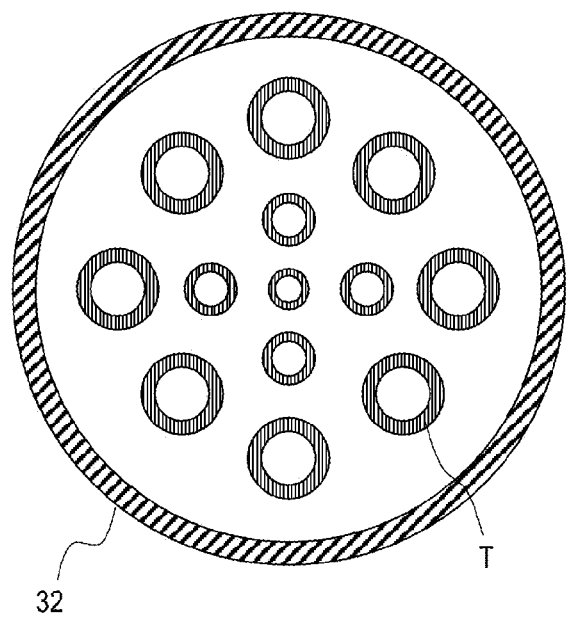
FIG. 30 illustrates a configuration example of the thermoelectric power generation unit in which diameters of the outside tubular thermoelectric generators are increased in a unit section perpendicular to the flow passage direction.
Figure 31:
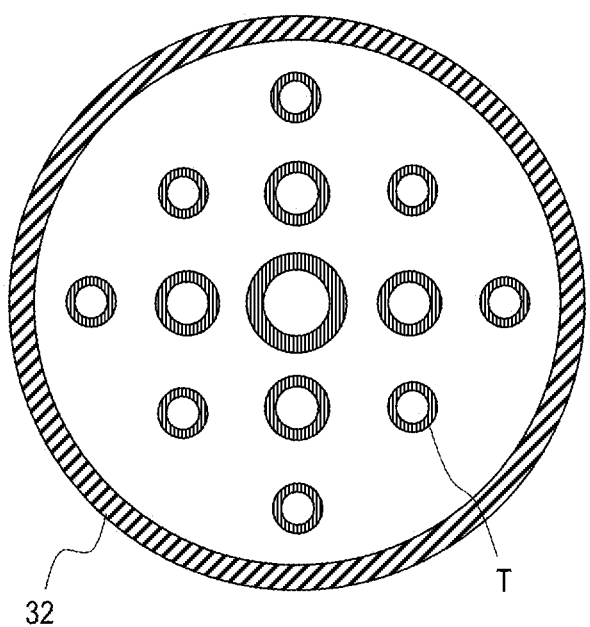
FIG. 31 illustrates a configuration example of the thermoelectric power generation unit in which the diameters of the outside tubular thermoelectric generators are decreased in the unit section perpendicular to the flow passage direction.

There are two effective methods for changing the diameter. As illustrated in FIG. 30, the impedance matching conditions can be matched with each other by increasing inner diameter r of tubular thermoelectric generator T toward the outside of the thermoelectric power generation unit in the section. As illustrated in FIG. 30, the impedance matching conditions may be matched with each other by increasing wall thickness d of tubular thermoelectric generator T toward the outside of the thermoelectric power generation unit. On the other hand, as illustrated in FIG. 31, the terminal voltages can be matched with each other by decreasing wall thickness d of the outside tubular thermoelectric generator.

<Method for Achieving Impedance Matching by Flow Rate Control>

Figure 29:
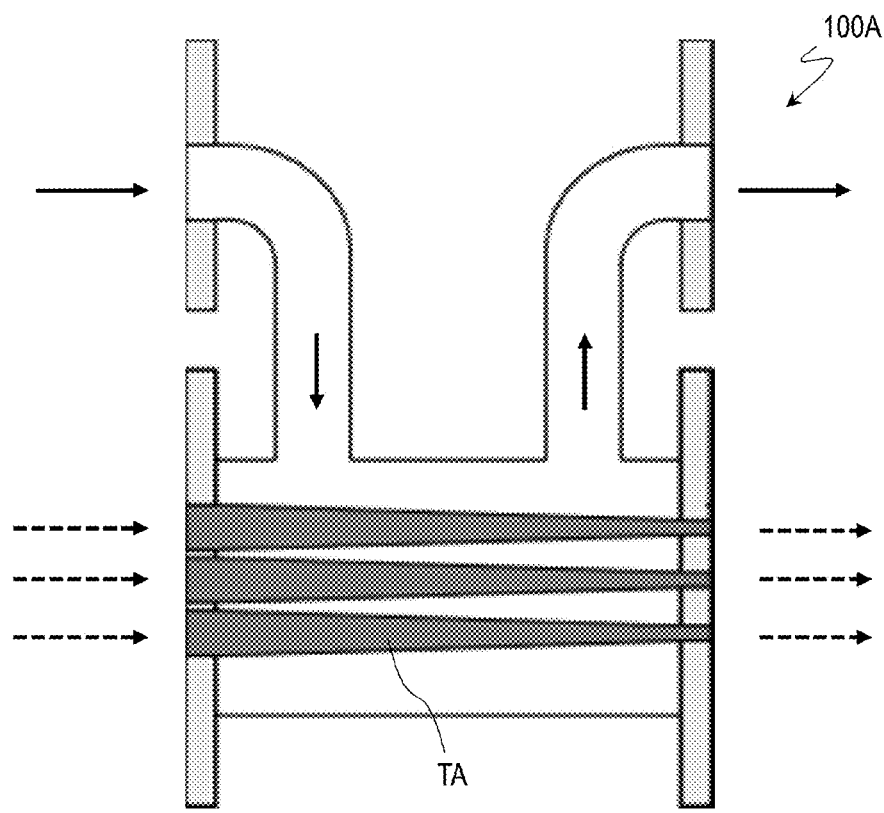
FIG. 29 illustrates a still another configuration example of the thermoelectric power generation system in which a diameter of the tubular thermoelectric generator is changed in the flow passage direction.

In the tubular thermoelectric generator of the configuration in FIG. 29, or between the thermoelectric power generation units of the configuration in FIGS. 27 and 28, a degree of decrease in temperature difference between the upstream side and the downstream side heavily depends on the fluid flow rate. For example, between the two thermoelectric power generation units adjacent to each other, it can be considered that the temperature difference in tubular thermoelectric generator T included in the downstream thermoelectric power generation unit (for example, thermoelectric power generation unit 100-2) is a times ($0<\alpha<1$) temperature difference $\Delta T$ in tubular thermoelectric generator T included in the upstream thermoelectric power generation unit (for example, thermoelectric power generation unit 100-1). $\alpha$ increases with increasing flow rate, and comes close to 1. Therefore, when the actual flow rate largely deviates from the assumed flow rate, there is a risk that the condition for matching the impedance matching conditions or the terminal voltages is not satisfied.

This problem can be solved by providing a flow rate controller in a feed port and/or a discharge port of the high-temperature medium (for example, hot water) and/or the low-temperature medium (for example, cool water). The flow rate is measured with the flow rate controller. When the measured flow rate is larger than the flow rate satisfying the impedance matching, the impedance matching condition can be satisfied by adjusting (controlling) the flow rate. Examples of a method for controlling the flow rate include a method for opening and closing the valve and a method for providing a bypass flow passage in the flow rate controller. In the case where a small amount of hot water or cool water is supplied, a container such as a tank is provided on the upstream side of the flow rate controller, the impedance matching can be achieved during running by an intermittent running method in which a container such as a tank is provided on the upstream side of the flow rate controller to supply the hot water/cool water at a stage at which a given water amount is accumulated.

The thermoelectric power generation system of the present disclosure can be used as a power generator in which the emission gas emitted from an automobile or a factory is used. The thermoelectric power generation unit of the present disclosure can be used as a power generator in which the emission gas emitted from an automobile or a factory is used, or a compact portable power generator.

The invention claimed is:
1. A thermoelectric power generation system comprising first and second thermoelectric power generation units, wherein:
   each of the first and second thermoelectric power generation units includes a plurality of tubular thermoelectric generators,
   each of the plurality of tubular thermoelectric generators includes: an outer circumferential surface; an inner circumferential surface; and a flow passage that is partitioned by the inner circumferential surface,
   an electromotive force is generated in an axial direction of each of the tubular thermoelectric generators by a temperature difference between the inner circumferential surface and the outer circumferential surface,
   each of the first and second thermoelectric power generation units further includes:
      a vessel in which the plurality of tubular thermoelectric generators are accommodated, the vessel including a fluid inlet, a fluid outlet, and a plurality of openings, the fluid inlet and the fluid outlet being used to cause a fluid to flow in the vessel, each of the tubular thermoelectric generators being inserted in the plurality of openings; and
      a plurality of conductive members that electrically connect the plurality of tubular thermoelectric generators, and
   the first and second thermoelectric power generation units are electrically connected in series such that a current providing a first impedance matching condition caused by the plurality of tubular thermoelectric generators included in the first thermoelectric power generation unit is matched with a current providing a second impedance matching condition caused by the plurality of tubular thermoelectric generators included in the second thermoelectric power generation unit, wherein the first and second thermoelectric power generation units are disposed such that the fluid flows in the vessel included in the second thermoelectric power generation unit after flowing in the vessel included in the first thermoelectric power generation unit, and the first impedance matching condition is matched with the second impedance matching condition by setting a number of tubular thermoelectric generators included in the first thermoelectric power generation unit to be larger than a number of tubular thermoelectric generators included in the second thermoelectric power generation unit.

* * * * *